United States Patent
Shen et al.

(10) Patent No.: US 8,386,906 B2
(45) Date of Patent: *Feb. 26, 2013

(54) MULTI-CSI (CYCLIC SHIFTED IDENTITY) SUB-MATRIX BASED LDPC (LOW DENSITY PARITY CHECK) CODES

(75) Inventors: Ba-Zhong Shen, Irvine, CA (US); Tak K. Lee, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/424,159

(22) Filed: Mar. 19, 2012

(65) Prior Publication Data

US 2012/0185745 A1     Jul. 19, 2012

Related U.S. Application Data

(63) Continuation of application No. 12/556,379, filed on Sep. 9, 2009, now Pat. No. 8,145,986.

(60) Provisional application No. 61/099,126, filed on Sep. 22, 2008.

(51) Int. Cl.
*G06F 11/00* (2006.01)
(52) U.S. Cl. ......................... 714/801; 714/758
(58) Field of Classification Search .................. 706/15; 714/752, 758, 786, 807, 801, 804
See application file for complete search history.

(56) References Cited

U.S. PATENT DOCUMENTS

| | | | | |
|---|---|---|---|---|
| 6,633,856 B2 * | 10/2003 | Richardson et al. | | 706/15 |
| 6,957,375 B2 * | 10/2005 | Richardson | | 714/752 |
| 7,222,289 B2 * | 5/2007 | Hung | | 714/807 |
| 7,246,304 B2 * | 7/2007 | Kim | | 714/801 |
| 7,299,397 B2 * | 11/2007 | Yokokawa et al. | | 714/752 |
| 7,530,002 B2 * | 5/2009 | Lee et al. | | 714/758 |
| 7,644,339 B2 * | 1/2010 | Tran et al. | | 714/758 |
| 8,010,881 B2 * | 8/2011 | Blanksby et al. | | 714/786 |
| 2007/0157061 A1 * | 7/2007 | Lee et al. | | 714/752 |
| 2009/0158112 A1 * | 6/2009 | Oh et al. | | 714/752 |
| 2010/0325511 A1 * | 12/2010 | Oh et al. | | 714/752 |

* cited by examiner

*Primary Examiner* — David Ton
(74) *Attorney, Agent, or Firm* — Garlick & Markison; Shayne X. Short

(57) ABSTRACT

Multi-CSI (Cyclic Shifted Identity) sub-matrix based LDPC (Low Density Parity Check) codes. A CSI parameter set, that includes at least one dual-valued entry and may also include at least one single-valued entry, and/or at least one all-zero-valued entry, is employed to generate an LDPC matrix. One of the single-valued entries may be 0 (being used to generate a CSI matrix with cyclic shift value of 0, corresponding to an identity sub-matrix such that all entries along the diagonal have elements values of 1, and all other elements therein are 0). Once the LDPC matrix is generated, it is employed to decode an LDPC coded signal to make an estimate of an information bit encoded therein. Also, the LDPC matrix may itself be used as an LDPC generator matrix (or the LDPC generator matrix may alternatively be generated by processing the LDPC matrix) for use in encoding an information bit.

20 Claims, 18 Drawing Sheets

Fig. 10 (rate 7/8 code)

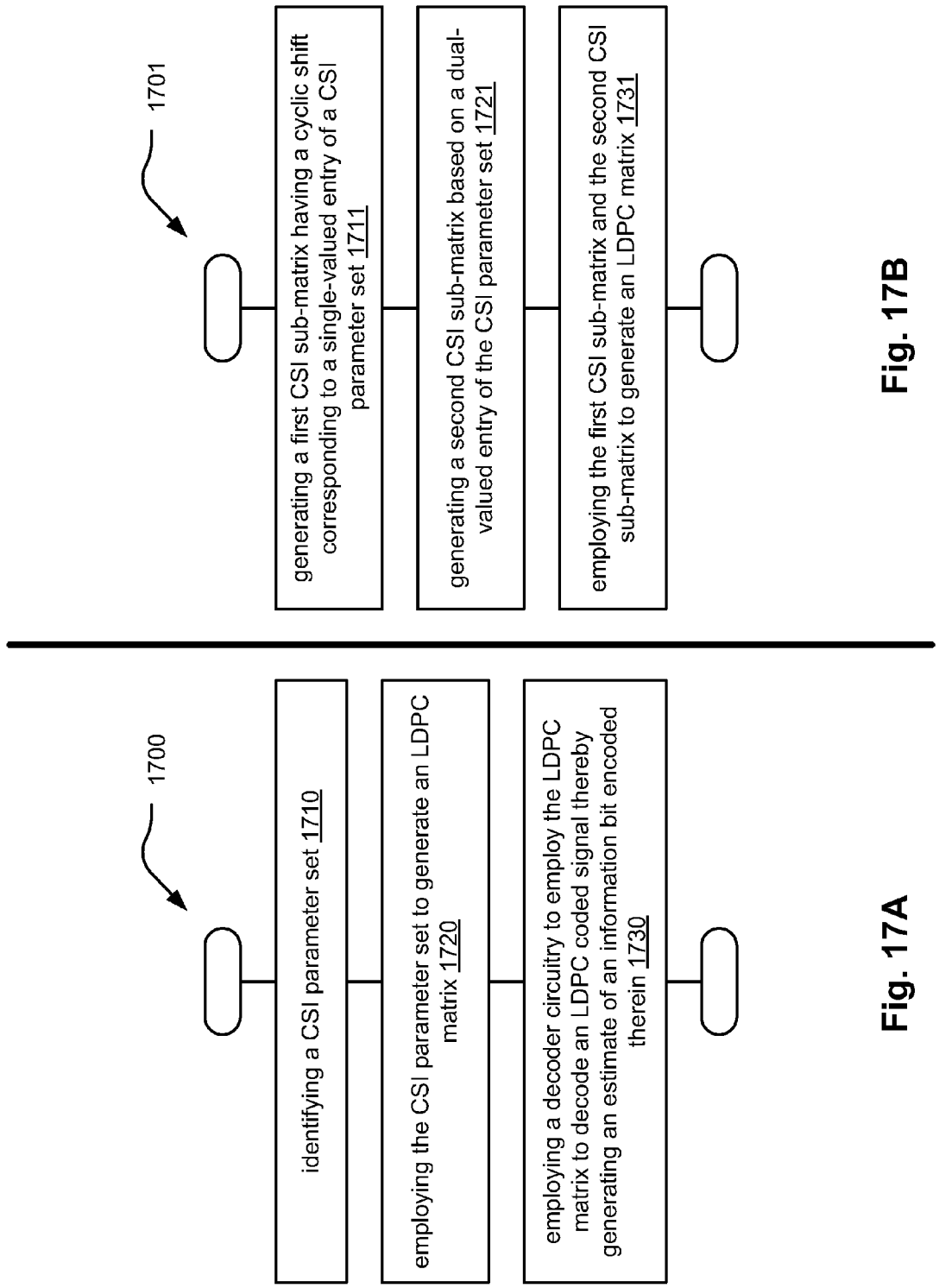

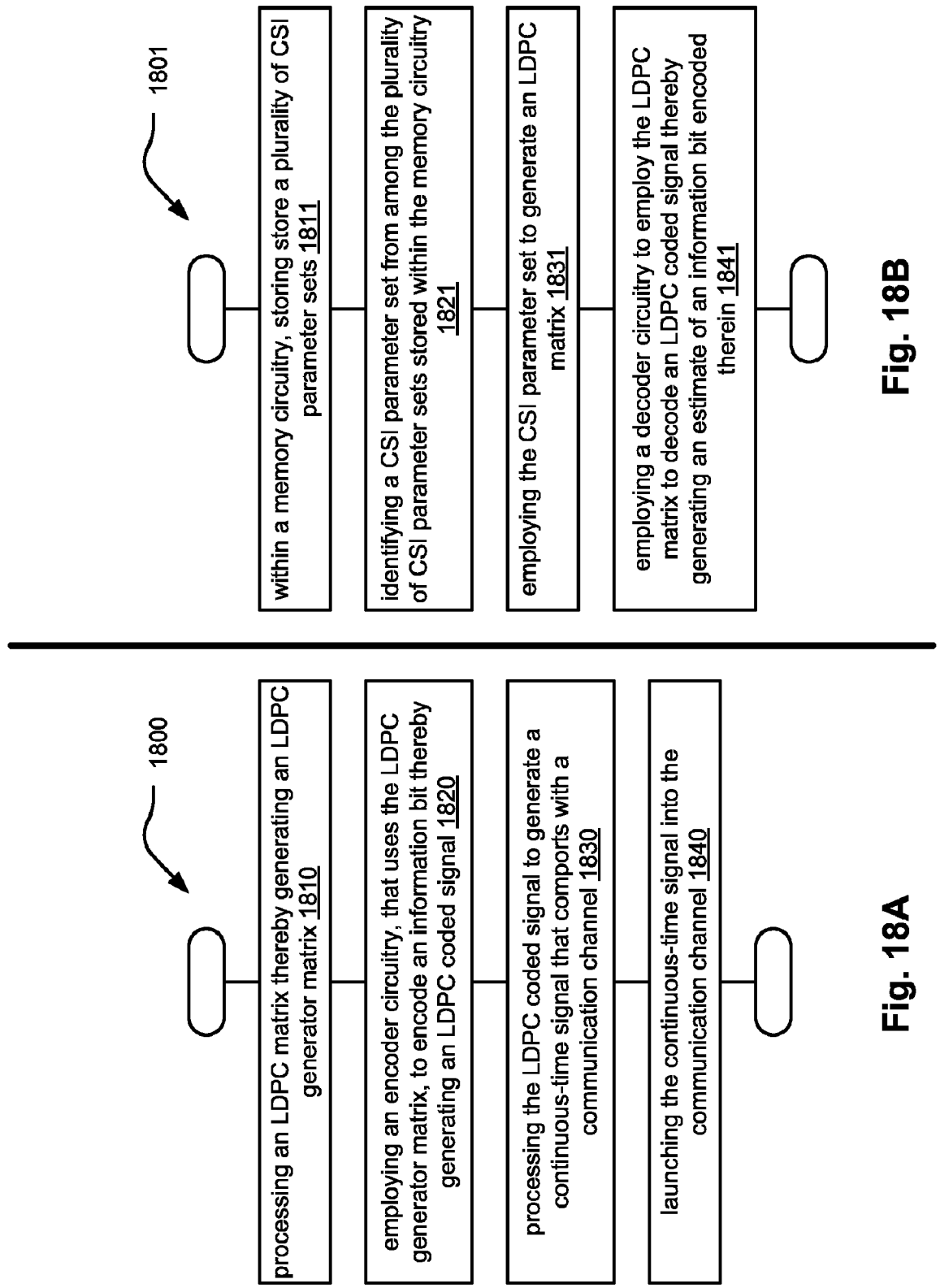

MULTI-CSI (CYCLIC SHIFTED IDENTITY) SUB-MATRIX BASED LDPC (LOW DENSITY PARITY CHECK) CODES

CROSS REFERENCE TO RELATED PATENTS/PATENT APPLICATIONS

Continuation Priority Claim, 35 U.S.C. §120

The present U.S. Utility patent application claims priority pursuant to 35 U.S.C. §120, as a continuation, to the following U.S. Utility patent application which is hereby incorporated herein by reference in its entirety and made part of the present U.S. Utility patent application for all purposes:

1. U.S. Utility patent application Ser. No. 12/556,379, entitled "Multi-CSI (Cyclic Shifted Identity) sub-matrix based LDPC (Low Density Parity Check) codes,", filed Sep. 9, 2009, pending, and scheduled to be issued as U.S. Pat. No. 8,145,986 on Mar. 27, 2012 (as indicated in an ISSUE NOTIFICATION mailed on Mar. 7, 2012), which claims priority pursuant to 35 U.S.C. §119(e) to the following U.S. Provisional patent application which is hereby incorporated herein by reference in its entirety and made part of the present U.S. Utility patent application for all purposes:

a. U.S. Provisional Application Ser. No. 61/099,126, entitled "Multi-CSI (Cyclic Shifted Identity) sub-matrix based LDPC (Low Density Parity Check) codes,", filed Sep. 22, 2008, now expired.

BACKGROUND OF THE INVENTION

1. Technical Field of the Invention

The invention relates generally to means for generating an LDPC code for use in encoding and/or decoding signals within communication systems; and, more particularly, it relates to the use of dual-valued and single-valued elements within a CSI parameter set to generate an LDPC code for use in encoding and/or decoding of such signals within communication systems.

2. Description of Related Art

Data communication systems have been under continual development for many years. One such type of communication system that has been of significant interest lately is a communication system that employs iterative error correction codes (ECCs). Of particular interest is a communication system that employs LDPC (Low Density Parity Check) code. Communications systems with iterative codes are often able to achieve lower bit error rates (BER) than alternative codes for a given signal to noise ratio (SNR).

A continual and primary directive in this area of development has been to try continually to lower the SNR required to achieve a given BER within a communication system. The ideal goal has been to try to reach Shannon's limit in a communication channel. Shannon's limit may be viewed as being the data rate to be used in a communication channel, having a particular SNR, that achieves error free transmission through the communication channel. In other words, the Shannon limit is the theoretical bound for channel capacity for a given modulation and code rate.

LDPC code has been shown to provide for excellent decoding performance that can approach the Shannon limit in some cases. For example, some LDPC decoders have been shown to come within 0.3 dB (decibels) from the theoretical Shannon limit. While this example was achieved using an irregular LDPC code with a length of one million, it nevertheless demonstrates the very promising application of LDPC codes within communication systems.

The use of LDPC coded signals continues to be explored within many newer application areas. Some examples of possible communication systems that may employ LDPC coded signals include communication systems employing 4 wire twisted pair cables for high speed Ethernet applications (e.g., 10 Gbps (Giga-bits per second) Ethernet operation according to the IEEE 802.3an (10 GBASE-T) emerging standard) as well as communication systems operating within a wireless context (e.g., in the IEEE 802.11 context space including the IEEE 802.11n emerging standard).

For any of these particular communication system application areas, near-capacity achieving error correction codes are very desirable. The latency constraints, which would be involved by using traditional concatenated codes, simply preclude their use in such applications in very high data rate communication system application areas.

Generally speaking, within the context of communication systems that employ LDPC codes, there is a first communication device at one end of a communication channel with encoder capability and second communication device at the other end of the communication channel with decoder capability. In many instances, one or both of these two communication devices includes encoder and decoder capability (e.g., within a bi-directional communication system). LDPC codes can be applied in a variety of additional applications as well, including those that employ some form of data storage (e.g., hard disk drive (HDD) applications and other memory storage devices) in which data is encoded before writing to the storage media, and then the data is decoded after being read/retrieved from the storage media.

BRIEF DESCRIPTION OF THE SEVERAL VIEWS OF THE DRAWINGS

FIG. 17A illustrates an embodiment 1700 of a method for LDPC matrix generation and subsequent use in decoding an LDPC coded signal.

FIG. 17B illustrates an embodiment 1701 of a method for LDPC matrix generation.

FIG. 18A illustrates an embodiment 1800 of a method for LDPC generator matrix generation and subsequent use in encoding to generate an LDPC coded signal.

FIG. 18B illustrates an embodiment 1801 of an alternative method for LDPC matrix generation and subsequent use in decoding an LDPC coded signal.

DETAILED DESCRIPTION OF THE INVENTION

Communication systems have been around for some time, and their presence into modern life is virtually ubiquitous (e.g., television communication systems, telecommunication systems including wired and wireless communication systems, etc.). As these communication systems continue to be developed, there is an ever present need for designing various means by which information may be encoded for transmitting from a first location to a second location. In accordance with this, error correction codes (ECCs) are a critical component in ensuring that the information received at the second location is actually the information sent from the first location. LDPC (Low Density Parity Check) codes are one such type of ECC that can be employed within any of a variety of communication systems.

It is noted that any of the following embodiments and approaches described herein are applicable regardless of any overall LDPC decoder architecture which may be employed, e.g., whether fully parallel, partially parallel, or serial in a particular architecture/hardware implementation.

Figure 1:
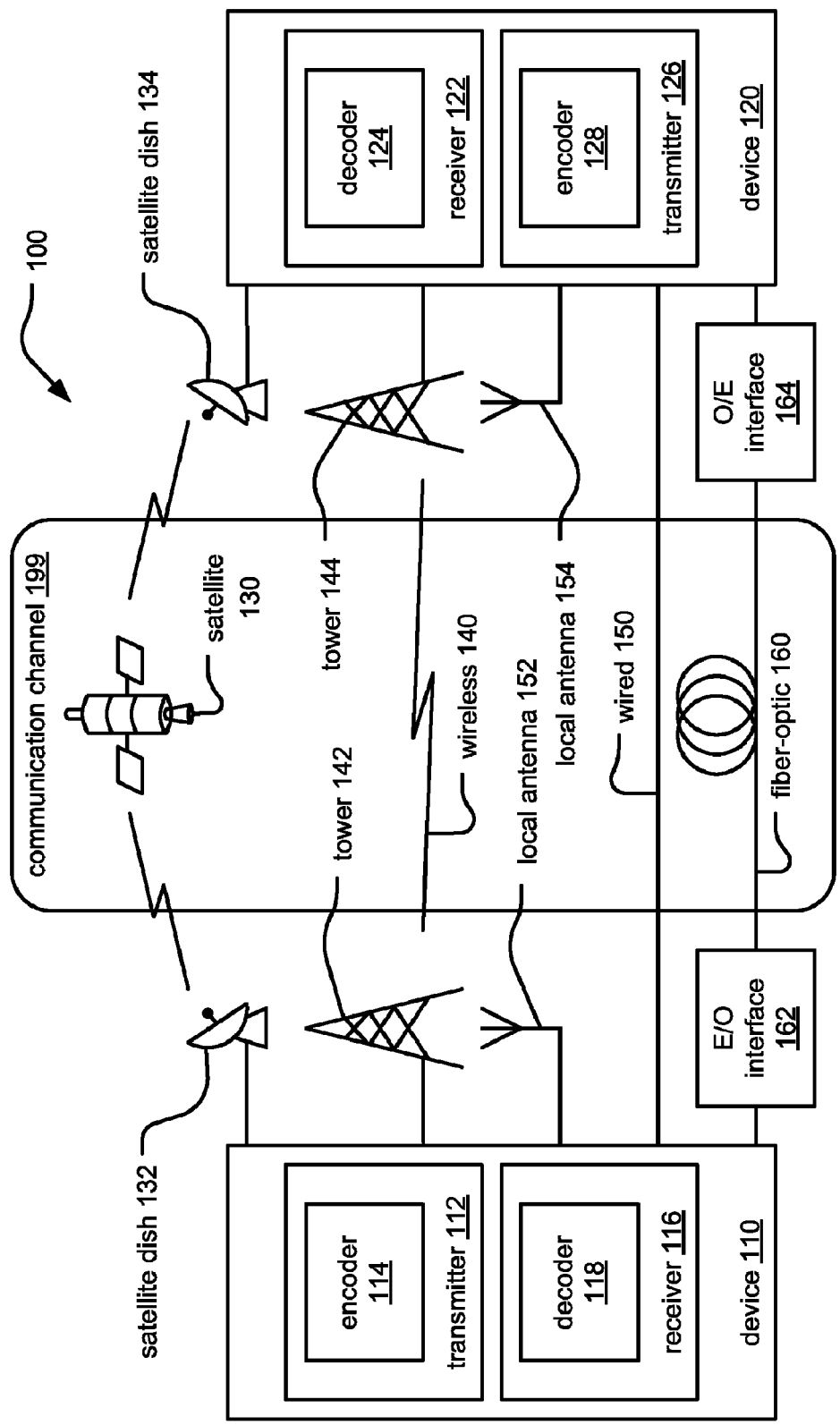
FIG. 1 and FIG. 2 illustrate various embodiments of communication systems.

The goal of digital communications systems is to transmit digital data from one location, or subsystem, to another either error free or with an acceptably low error rate. As shown in FIG. 1, data may be transmitted over a variety of communications channels in a wide variety of communication systems: magnetic media, wired, wireless, fiber, copper, and other types of media as well.

Figure 2:
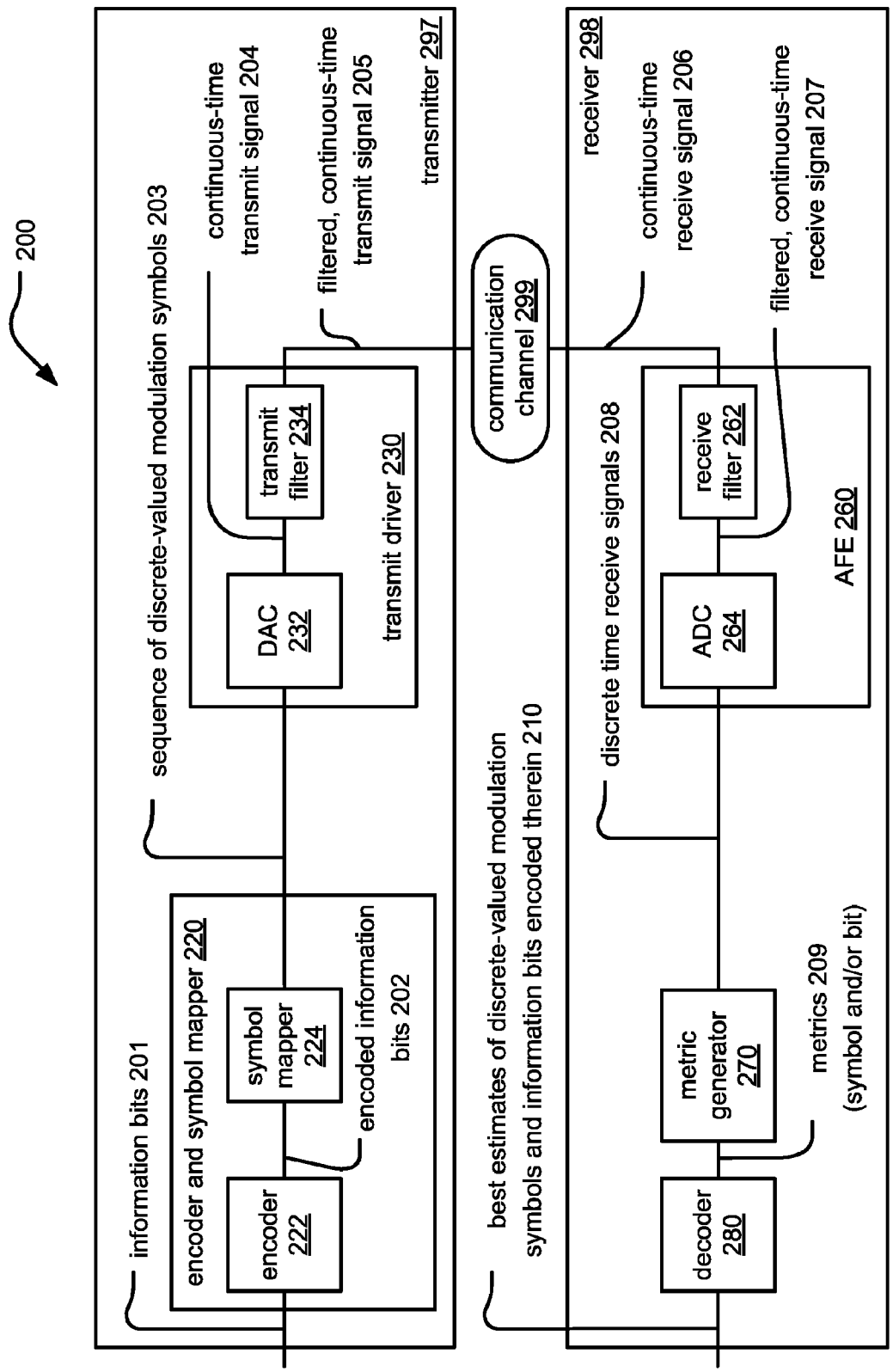

FIG. 1 and FIG. 2 are diagrams illustrate various embodiments of communication systems, 100 and 200, respectively.

Referring to FIG. 1, this embodiment of a communication system 100 is a communication channel 199 that communicatively couples a communication device 110 (including a transmitter 112 having an encoder 114 and including a receiver 116 having a decoder 118) situated at one end of the communication channel 199 to another communication device 120 (including a transmitter 126 having an encoder 128 and including a receiver 122 having a decoder 124) at the other end of the communication channel 199. In some embodiments, either of the communication devices 110 and 120 may only include a transmitter or a receiver. There are several different types of media by which the communication channel 199 may be implemented (e.g., a satellite communication channel 130 using satellite dishes 132 and 134, a wireless communication channel 140 using towers 142 and 144 and/or local antennae 152 and 154, a wired communication channel 150, and/or a fiber-optic communication channel 160 using electrical to optical (E/O) interface 162 and optical to electrical (O/E) interface 164)). In addition, more than one type of media may be implemented and interfaced together thereby forming the communication channel 199.

To reduce transmission errors that may undesirably be incurred within a communication system, error correction and channel coding schemes are often employed. Generally, these error correction and channel coding schemes involve the use of an encoder at the transmitter and a decoder at the receiver.

Any of the various types of LDPC codes described herein can be employed within any such desired communication system (e.g., including those variations described with respect to FIG. 1), any information storage device (e.g., hard disk drives (HDDs), network information storage devices and/or servers, etc.) or any application in which information encoding and/or decoding is desired.

Referring to the communication system 200 of FIG. 2, at a transmitting end of a communication channel 299, information bits 201 are provided to a transmitter 297 that is operable to perform encoding of these information bits 201 using an encoder and symbol mapper 220 (which may be viewed as being distinct functional blocks 222 and 224, respectively) thereby generating a sequence of discrete-valued modulation symbols 203 that is provided to a transmit driver 230 that uses a DAC (Digital to Analog Converter) 232 to generate a continuous-time transmit signal 204 and a transmit filter 234 to generate a filtered, continuous-time transmit signal 205 that substantially comports with the communication channel 299. At a receiving end of the communication channel 299, continuous-time receive signal 206 is provided to an AFE (Analog Front End) 260 that includes a receive filter 262 (that generates a filtered, continuous-time receive signal 207) and an ADC (Analog to Digital Converter) 264 (that generates discrete-time receive signals 208). A metric generator 270 calculates metrics 209 (e.g., on either a symbol and/or bit basis) that are employed by a decoder 280 to make best estimates of the discrete-valued modulation symbols and information bits encoded therein 210.

The decoders of either of the previous embodiments may be implemented to include various aspects and/or embodiment of the invention therein. In addition, several of the following Figures describe other and particular embodiments (some in more detail) that may be used to support the devices, systems, functionality and/or methods that may be implemented in accordance with certain aspects and/or embodiments of the invention. One particular type of signal that is processed according to certain aspects and/or embodiments of the invention is an LDPC coded signal. Before more details are provided below, a general description of LDPC codes is provided.

Figure 3:
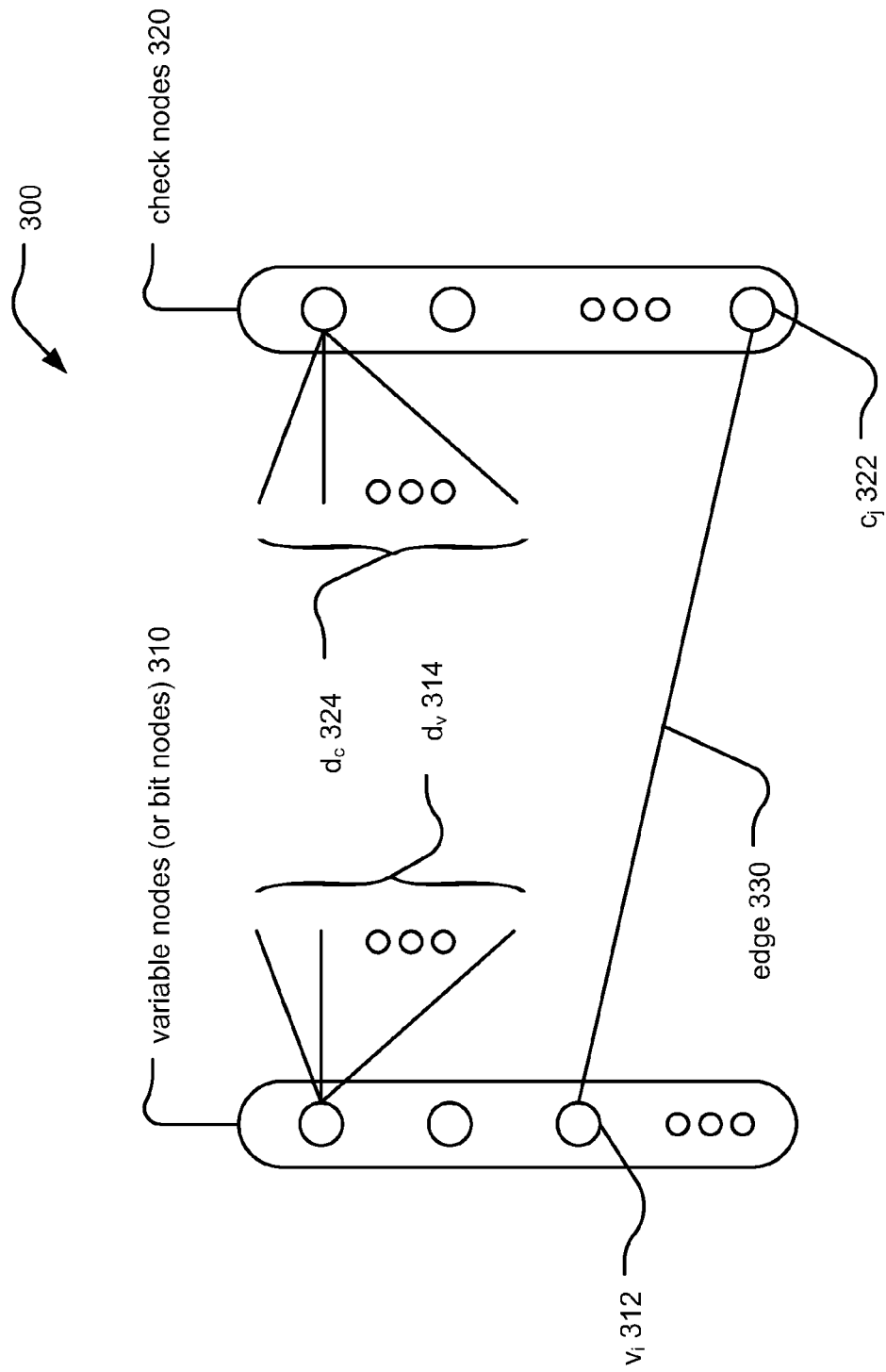
FIG. 3 illustrates an embodiment of an LDPC (Low Density Parity Check) code bipartite graph.

FIG. 3 illustrates an embodiment of an LDPC (Low Density Parity Check) code bipartite graph 300. In the art, an LDPC bipartite graph may also sometimes be referred to as a "Tanner" graph. An LDPC code may be viewed as being a code having a binary parity check matrix such that nearly all of the elements of the matrix have values of zeroes (e.g., the binary parity check matrix is sparse). For example, $H = (h_{i,j})_{M \times N}$ may be viewed as being a parity check matrix of an LDPC code with block length N.

LDPC codes are linear block codes and hence the set of all codewords x∈C spans the null space of a parity check matrix, H.

$$Hx^T = 0, \forall x \in C \quad (1)$$

For LDPC codes, H, is a sparse binary matrix of dimension m×n. Each row of H corresponds to a parity check and a set element $h_{ij}$ indicates that data symbol j participates in parity check i. Each column of H corresponds to a codeword symbol.

For each codeword x there are n symbols of which m are parity symbols. Hence the code rate r is given by:

$$r = (n-m)/n \quad (2)$$

The row and column weights are defined as the number of set elements in a given row or column of H, respectively. The set elements of H are chosen to satisfy the performance requirements of the code. The number of 1's in the i-th column of the parity check matrix, H, may be denoted as $d_v(i)$, and the number of 1's in the j-th row of the parity check matrix may be denoted as $d_c(j)$. If $d_v(i) = d_v$ for all i, and $d_c(j) = d_c$ for all j, then the LDPC code is called a $(d_v, d_c)$ regular LDPC code, otherwise the LDPC code is called an irregular LDPC code.

LDPC codes were introduced by R. Gallager in [1] referenced below (also in [2] referenced below) and by M. Luby et al. in [3] also referenced below.

[1] R. Gallager, *Low-Density Parity-Check Codes*, Cambridge, Mass.: MIT Press, 1963.
[2] R. G. Gallager, "Low density parity check codes," *IRE Trans. Info. Theory*, vol. IT-8, January 1962, pp. 21-28.
[3] M. G. Luby, M. Mitzenmacher, M. A. Shokrollahi, D. A. Spielman, and V. Stemann, "Practical Loss-Resilient Codes", *Proc. 29th Symp. on Theory of Computing*, 1997, pp. 150-159.

A regular LDPC code can be represented as a bipartite graph 300 by its parity check matrix with left side nodes representing variable of the code bits (or alternatively as the "variable nodes" (or "bit nodes") 310 in a bit decoding approach to decoding LDPC coded signals), and the right side nodes representing check equations (or alternatively as the "check nodes" 320). The bipartite graph 300 (or sometimes referred to as a Tanner graph 300) of the LDPC code defined by H may be defined by N variable nodes (e.g., N bit nodes) and M check nodes. Every variable node of the N variable nodes 310 has exactly $d_v(i)$ edges (an example edge shown using reference numeral 330) connecting the bit node, $v_i$ 312, to one or more of the check nodes (within the M check nodes). The edge 330 is specifically shown as connecting from the bit node, $v_i$ 312, to the check node, $c_j$ 322. This number of $d_v$ edges (shown as $d_v$ 314) may be referred to as the degree of a variable node i. Analogously, every check node of the M check nodes 320 has exactly $d_c(j)$ edges (shown as $d_c$ 324) connecting this node to one or more of the variable nodes (or bit nodes) 310. This number of edges, $d_c$, may be referred to as the degree of the check node j.

An edge 330 between a variable node $v_i$ (or bit node $b_i$) 312 and check node $c_j$ 322 may be defined by e=(i, j). However, on the other hand, given an edge e=(i, j), the nodes of the edge may alternatively be denoted as by e=(v(e),c(e)) (or e=(b(e), c(e))). Alternatively, the edges in the graph correspond to the set elements of H where a set element $h_{ji}$ indicates that an edge connects a bit (e.g., variable) node i with parity check node j.

Given a variable node $v_i$ (or bit node $b_i$), one may define the set of edges emitting from the node $v_i$ (or bit node $b_i$) by $E_v(i) = \{e|v(e)=i\}$ (or by $E_b(i) = \{e|b(e)=i\}$); these edges are referred to as bit edges, and the messages corresponding to these bit edges are referred to as bit edge messages.

Given a check node $c_j$, one may define the set of edges emitting from the node $c_j$ by $E_c(j) = \{e|c(e)=j\}$; these edges are referred to as check edges, and the messages corresponding to these check edges are referred to as check edge messages. Continuing on, the derivative result will be $|E_v(i)|=d_v$ (or $|E_b(i)|=d_b$) and $|E_c(j)|=d_c$.

Generally speaking, any codes that can be represented by a bipartite graph may be characterized as a graph code. It is also noted that an irregular LDPC code may also described using a bipartite graph. However, the degree of each set of nodes within an irregular LDPC code may be chosen according to some distribution. Therefore, for two different variable nodes, $v_{i_1}$ and $v_{i_2}$, of an irregular LDPC code, $|E_v(i_1)|$ may not equal to $|E_v(i_2)|$. This relationship may also hold true for two check nodes. The concept of irregular LDPC codes was originally introduced within M. Luby et al. in [3] referenced above.

In general, with a graph of an LDPC code, the parameters of an LDPC code can be defined by a degree of distribution, as described within M. Luby et al. in [3] referenced above and also within the following reference [4]:

[4] T. J. Richardson and R. L. Urbanke, "The capacity of low-density parity-check code under message-passing decoding," *IEEE Trans. Inform. Theory*, Vol. 47, No. 2, February 2001, pp. 599-618.

This distribution may be described as follows:

Let $\lambda_i$ represent the fraction of edges emanating from variable nodes of degree i and let $\rho_i$ represent the fraction of edges emanating from check nodes of degree i. Then, a degree distribution pair $(\lambda, \rho)$ is defined as follows:

$$\lambda(x) = \sum_{i=2}^{M_v} \lambda_i x^{i-1} \text{ and } \rho(x) = \sum_{i=2}^{M_c} \rho_i x^{i-1},$$

where $M_v$ and $M_c$ represent the maximal degrees for variable nodes and check nodes, respectively.

While many of the illustrative embodiments described herein utilize regular LDPC code examples, it is noted that certain aspects and/or embodiments of the invention are also operable to accommodate both regular LDPC codes and irregular LDPC codes.

It is also noted that many of the embodiments described herein employ the terminology of "bit node" and "bit edge message", or equivalents thereof. Oftentimes, in the art of LDPC decoding, the "bit node" and "bit edge message" are alternatively referred to as "variable node" and "variable edge message", in that, the bit values (or variable values) are those which are attempted to be estimated. Either terminology can be employed in accordance with certain aspects of the invention.

In accordance with LDPC coding, quasi-cyclic LDPC codes (as described in reference [5]) have become increasingly popular in recent times.

[5] Marc P. C. Fossorier, "Quasi-Cyclic Low-Density Parity-Check Codes From Circulant Permutation Matrices," *IEEE Trans. Inform. Theory*, Vol. 50, No. 8, August 2004, pp. 1788-1793.

A general description of such a quasi-cyclic LDPC code is that each codeword thereof, after undergoing a cyclic shift, will result in another codeword of the LDPC in most cases; since this is not true necessarily for all codewords of the LDPC code, hence the use of the term "quasi".

Typically, the manner in which such quasi-cycle LDPC codes are constructed in the art is using a brute force approach in which a designer simply tries a large number of variations without any real design methodology. There is no efficient methodology in the prior art by which such quasi-cyclic LDPC codes may be constructed.

Herein, a methodology is presented by which a large number of quasi-cyclic LDPC codes can be constructed in a very efficient manner for comparison and selection of one or more of those LDPC codes to be used in any of a wide variety of communication systems types and communication device types. Any other application context (e.g., including information storage device, etc.) in which ECC may be employed can also use one or more of these LDPC codes.

In addition, the manner presented herein in which LDPC codes may be constructed allows for a designer to compare and employ various sub-matrix sizes of the corresponding LDPC matrices.

Figure 4:
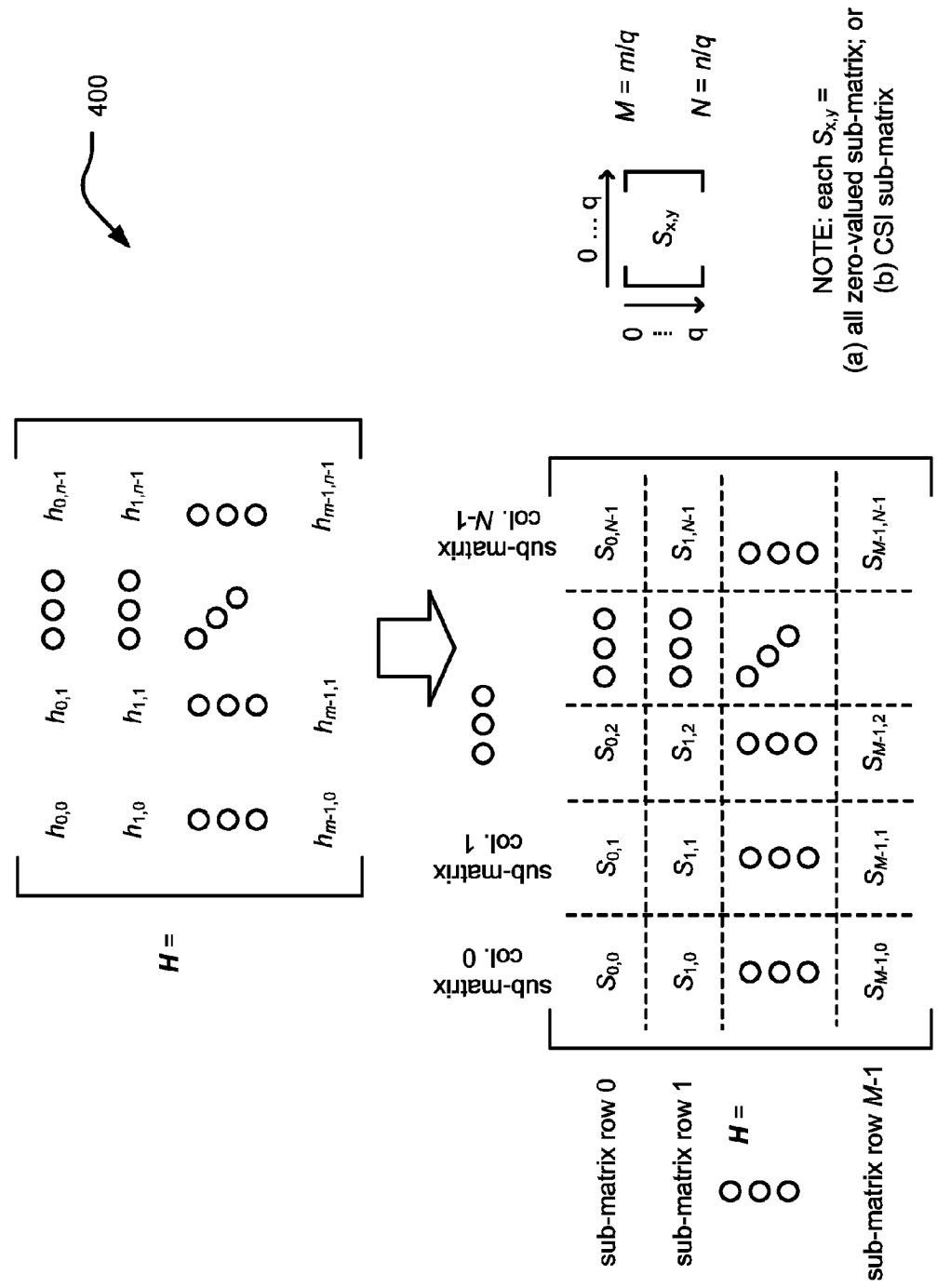
FIG. 4 illustrates an embodiment of the relationship between an overall LDPC matrix and the individual sub-matrices therein that include all zero-valued sub-matrices and/or CSI (Cyclic Shifted Identity) sub-matrices (including the sub-matrix rows and sub-matrix columns of the LDPC matrix).

FIG. 4 illustrates an embodiment 400 of the relationship between an overall LDPC matrix and the individual sub-matrices therein that include all zero-valued sub-matrices and/or CSI (Cyclic Shifted Identity) sub-matrices (including the sub-matrix rows and sub-matrix columns of the LDPC matrix).

A binary LDPC code may be fully described by its parity check matrix (i.e., its LDPC matrix). At the top of FIG. 4, the individual elements of an LDPC matrix, H, are shown:

$$H = \begin{bmatrix} h_{0,0} & h_{0,1} & \cdots & h_{0,n-1} \\ h_{1,0} & h_{1,1} & \cdots & h_{1,n-1} \\ \vdots & \vdots & \ddots & \vdots \\ h_{m-1,0} & h_{m-1,1} & \cdots & h_{m-1,n-1} \end{bmatrix}$$

where n is the number of bits in a codeword, m is the number of parity check equations of the LDPC code, and $h_{i,j}$ is either 0 or 1. An n-bit vector c (e.g., $c=(c_1, c_2, \ldots, c_N)$) is a codeword (i.e., of the LDPC code) if and only if $$Hc^T = 0.$$

For such an LDPC code, the parity matrix H is also composed of a number of q-by-q (i.e., q×q) square sub-matrices as shown in the bottom portion of FIG. 4 and also below:

$$H = \begin{bmatrix} S_{0,0} & S_{0,1} & \cdots & S_{0,N-1} \\ S_{1,0} & S_{1,1} & \cdots & S_{1,N-1} \\ \vdots & \vdots & \ddots & \vdots \\ S_{M-1,0} & S_{M-1,1} & \cdots & S_{M-1,N-1} \end{bmatrix}$$

where M=m/q, N=n/q, and each sub-matrix, $S_{I,J}$, thereof is a q-by-q sub-matrix that is either an all zero-valued sub-matrix (i.e., in which all elements thereof are the value or zero "0") or a CSI (Cyclic Shifted Identity) sub-matrix. A CSI sub-matrix S is characterized by a shift-value, $\lambda(S)$, such that the components of S are defined as follows:

$$s_{i,j} = \begin{cases} 1 & \text{if } i + \lambda(S) = j (\text{mod} q) \\ 0 & \text{otherwise} \end{cases}$$

for any i and j, with $0 \leq i < q$ and $0 \leq j < q$. For example, the q-by-q identity matrix is itself a CSI matrix with a shift-value $\lambda(S)=0$ (i.e., a CSI sub-matrix that has undergone a cyclic shift of zero "0").

As can be seen, the LDPC matrix (as depicted in the lower portion of the diagram), includes various sub-matrix rows and sub-matrix columns. These sub-matrix rows and sub-matrix columns may be viewed as being based on the sub-matrix construction of the LDPC matrix (e.g., shown as sub-matrix rows 0 through M−1 and sub-matrix columns 0 through N−1).

Figure 5:
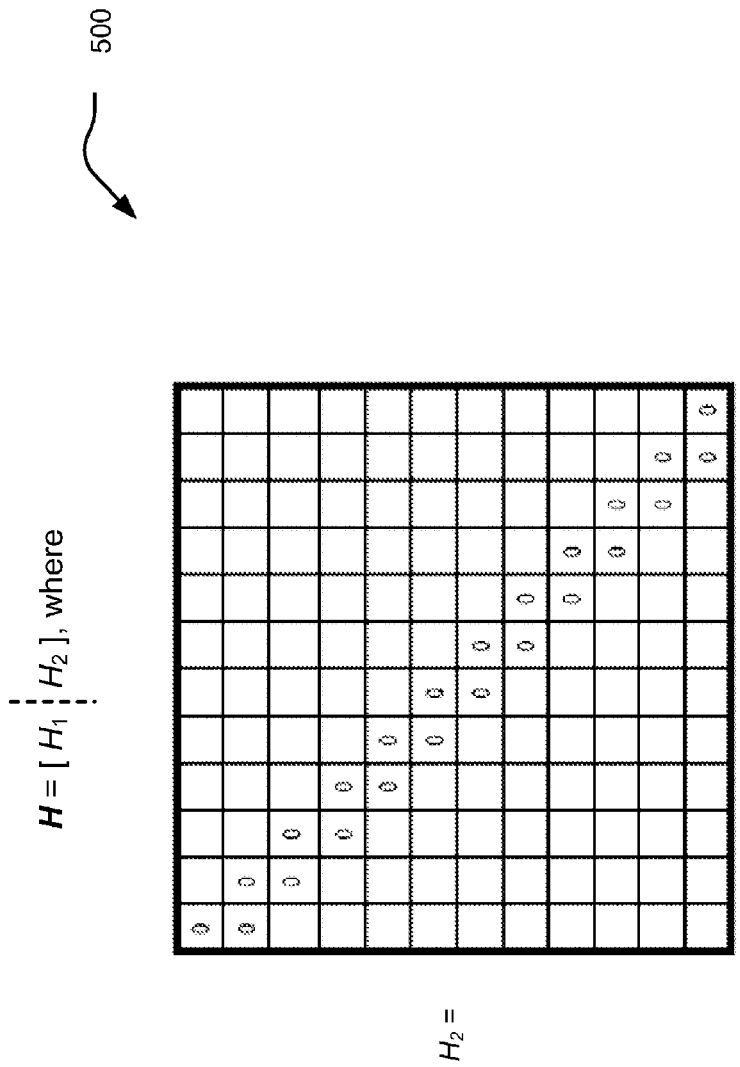
FIG. 5 illustrates an embodiment of a right hand side matrix of an LDPC matrix.

FIG. 5 illustrates an embodiment 500 of a right hand side matrix of an LDPC matrix. An LDPC matrix is composed of a plurality of sub-matrices each having a common size. The LDPC matrix s also partitioned into a left hand side matrix ($H_1$) and a right hand side matrix ($H_2$), such that the entire LDPC matrix, H, is depicted as follows:

$$H = [H_1 H_2].$$

The right hand side matrix ($H_2$) can have a number of different forms, and one particular embodiment is shown in this diagram.

The option for the right hand side matrix ($H_2$) as depicted in this diagram ensures that the LDPC matrix, H, is in fact invertible, and an LDPC codeword generated in accordance with this LDPC code includes all of the plurality of information bits that undergo encoding as well as parity bits (i.e., it is a systematic LDPC code). As can be seen with respect to this option, each sub-matrix within the right hand matrix is an all zero-valued sub-matrix except those sub-matrices identified below in (a) and (b):

(a) each sub-matrix located on a diagonal of the right hand side matrix is a CSI (Cyclic Shifted Identity) sub-matrix; and (b) in every row between a second row, which is below and adjacent to a top row, and a bottom row of the right hand side matrix, inclusive, each sub-matrix located on a left hand side of and adjacent to a sub-matrix located on the diagonal of the right hand side matrix is also a CSI sub-matrix.

In other words, all of the sub-matrices that have a corresponding blank therein are all zero-valued sub-matrices (i.e., all elements of those sub-matrices are a value of 0). However, all of the sub-matrices that have a corresponding 0 depicted therein are CSI sub-matrices having undergone a cyclic shift of 0 (i.e., they are identity sub-matrices).

Various embodiments are presented herein for LDPC codes of any desired code rate that may be employed in a variety of applications including piconets and/or personal area networks (PANs) that operate in accordance with the IEEE 802.15.3c emerging standard and/or the wireless local area network (WLAN) 802.11n emerging standards including those that comply with principles and recommended practices of NGmS.

Figure 6:
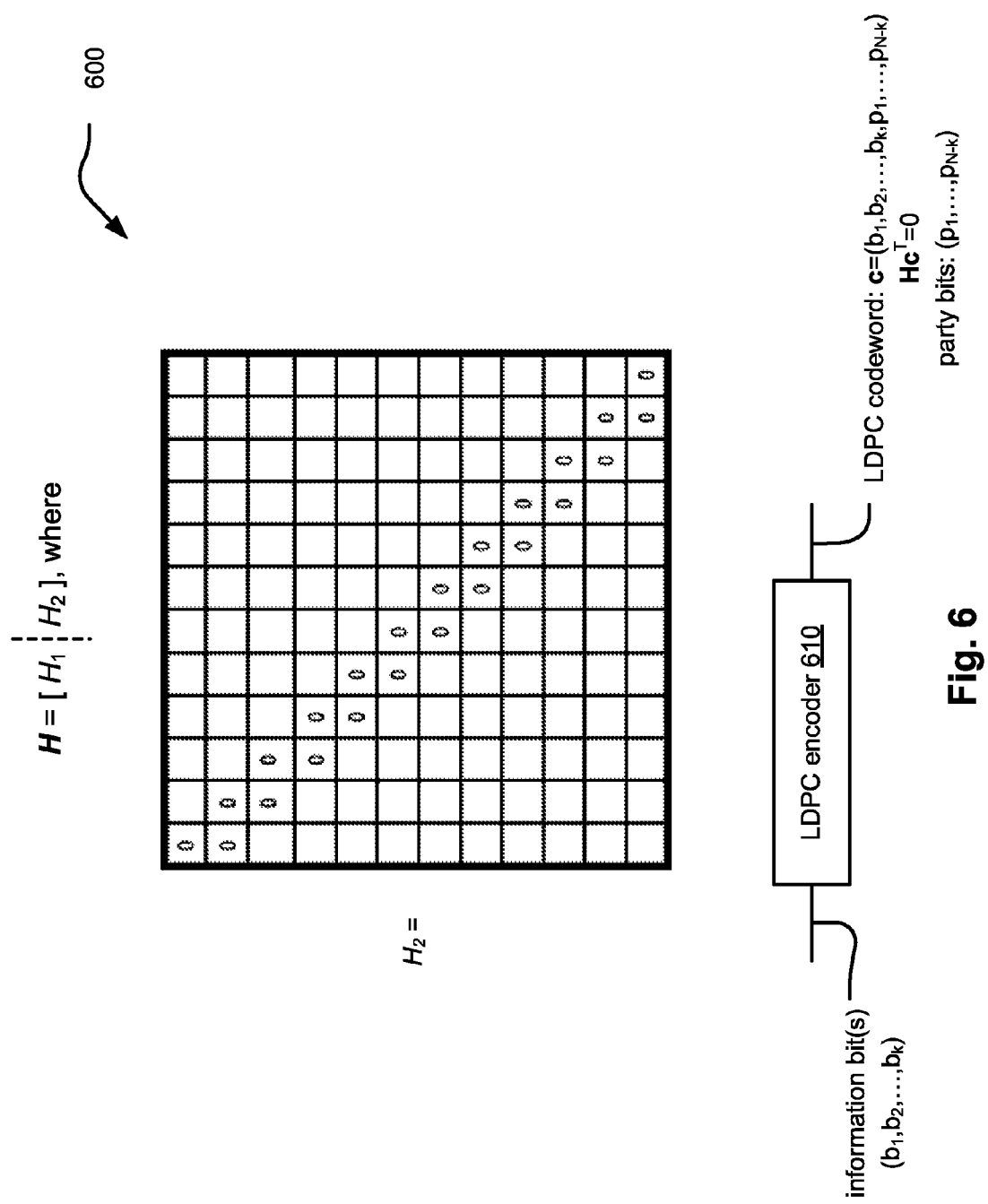
FIG. 6 illustrates an embodiment of encoding when a right hand side matrix of an LDPC matrix has a form similar to as shown in FIG. 5.

FIG. 6 illustrates an embodiment 600 of encoding when a right hand side matrix of an LDPC matrix has a form similar as shown in FIG. 5. An LDPC encoder 610 receives a plurality of information bits (shown as $(b_1, b_2, \ldots, b_k)$) and generates an LDPC codeword there from. It is noted that once an LDPC matrix is known, a corresponding generator matrix can be determined as well. If the LDPC matrix includes a right hand side matrix having a form similar to Option 3 as shown in FIG. 5, then direct back substitution can be employed and the corresponding LDPC encoding is straight-forward.

In this embodiment, the corresponding LDPC code is a systematic code, and the LDPC codeword is shown as $c=(b_1, b_2, \ldots, b_k, p_1, p_2, \ldots, p_{N-k})$, such that the LDPC codeword includes all of the information bits $(b_1, b_2, \ldots, b_k)$ as well as parity bits $(p_1, p_2, \ldots, p_{N-k})$.

It is noted that if the parity check matrix, H, has the form H=[H$_1$ H$_2$], and also has rank of N−k, then the right hand side matrix (H$_2$) is an (N−k)×(N−k) matrix and the following is true:

$$Hc^T = H(b_1, b_2, \ldots, b_k, p_1, p_2, \ldots, p_{N-k})^T = 0.$$

Also, the right hand side matrix (H$_2$) is then invertible.

Figure 7:
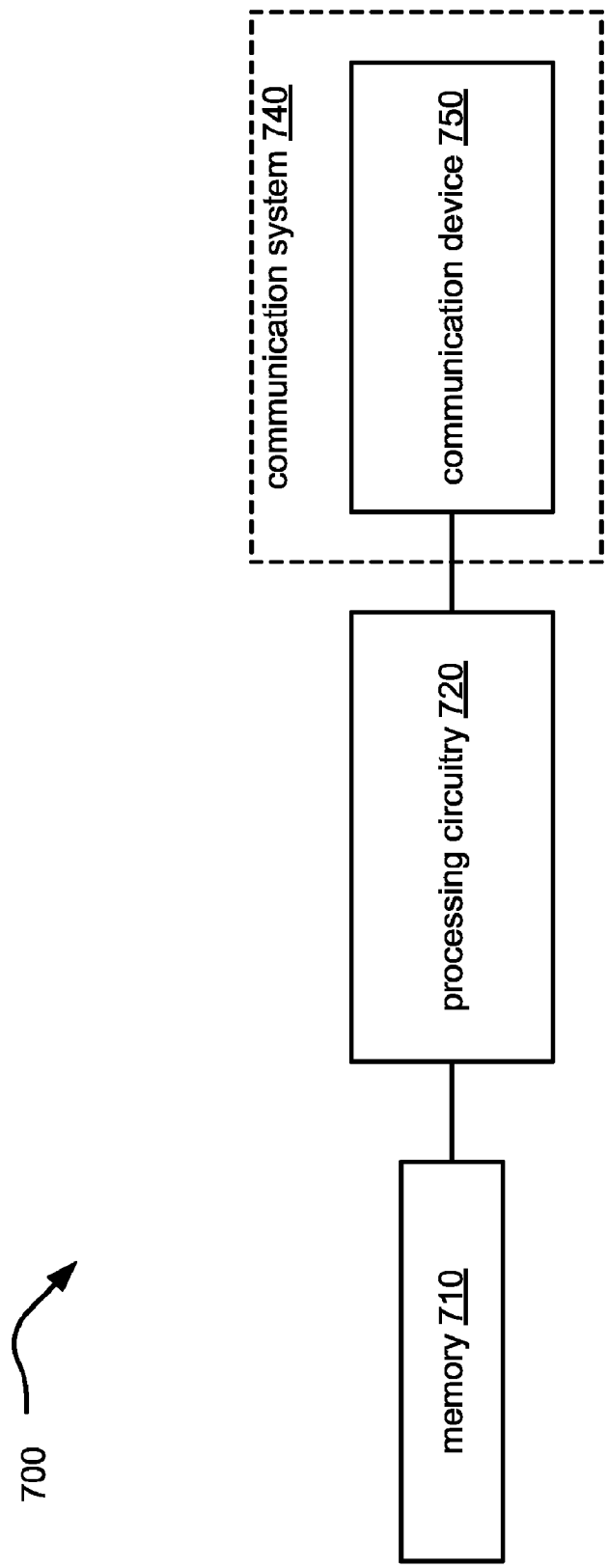
FIG. 7 illustrates an embodiment of an apparatus that is operable to perform LDPC decoding processing and/or LDPC code construction.

FIG. 7 illustrates an embodiment of an apparatus 700 that is operable to perform LDPC decoding processing and/or LDPC code construction. The apparatus 700 includes a processing module 720, and a memory 710. The memory 710 is coupled to the processing module 720, and the memory 710 is operable to store operational instructions that enable the processing module 720 to perform a variety of functions. The processing module 720 is operable to perform and/or direct the manner in which various LDPC codes may be constructed in accordance with any embodiment described herein, or any equivalent thereof.

The processing module 720 can be implemented using a shared processing device, individual processing devices, or a plurality of processing devices, among other types of circuitry or circuitries. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 710 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 720 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

If desired in some embodiments, the manner in which LDPC code construction is to be performed (e.g., the size of sub-matrices within the LDPC matrix of a corresponding LDPC code, the number of all-zero-valued sub-matrices, the cyclic shift (if any) of any sub-matrix within an LDPC matrix, etc.) can be provided from the apparatus 700 to a communication system 740 that is operable to employ and perform LDPC coding using a desired LDPC code. For example, information corresponding to the LDPC code being used (e.g., the parity check matrix of the LDPC code) can also be provided from the processing module 720 to any of a variety of communication devices 730 implemented within any desired such communication system 740 as well.

If desired, the apparatus 720 can be designed to generate multiple means of constructing LDPC codes in accordance with multiple needs and/or desires as well. In some embodiments, the processing module 720 can selectively provide different information (e.g., corresponding to different LDPC codes and their corresponding LDPC matrices, relative performance comparison between the various LDPC codes, etc.) to different communication devices and/or communication systems. That way, different communication links between different communication devices can employ different LDPC codes and/or means by which to perform LDPC encoding and/or decoding. Clearly, the processing module 720 can also provide the same information to each of different communication devices and/or communication systems as well without departing from the scope and spirit of the invention.

Figure 8:
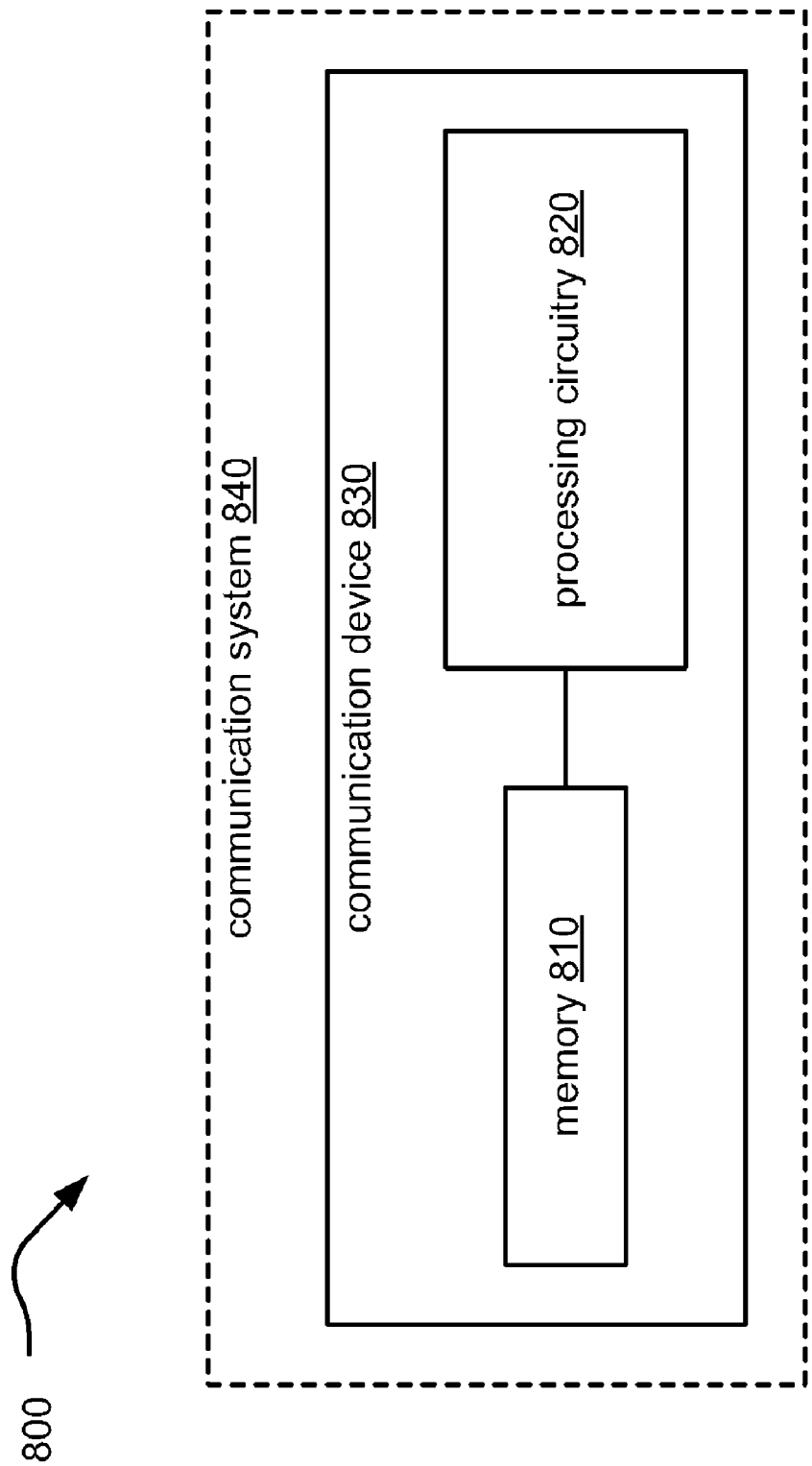
FIG. 8 illustrates an alternative embodiment of an apparatus that is operable to perform LDPC decoding processing and/or LDPC code construction.

FIG. 8 illustrates an alternative embodiment of an apparatus that is operable to perform LDPC decoding processing and/or LDPC code construction. The apparatus 800 includes a processing module 820, and a memory 810. The memory 810 is coupled to the processing module 820, and the memory 810 is operable to store operational instructions that enable the processing module 820 to perform a variety of functions. The processing module 820 (serviced by the memory 810) can be implemented as an apparatus capable to perform any of the functionality of any of the various modules and/or functional blocks described herein. For example, the processing module 820 (serviced by the memory 810) can be implemented as an apparatus capable to perform and/or direct the manner in which LDPC code construction is to be performed in accordance with any embodiment described herein, or any equivalent thereof.

The processing module 820 can be implemented using a shared processing device, individual processing devices, or a plurality of processing devices, among other types of circuitry or circuitries. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 810 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 820 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

If desired in some embodiments, the apparatus 800 can be any of a variety of communication devices 830, or any part or portion of any such communication device 830. Any such communication device that includes the processing module 820 and/or memory 810 can be implemented within any of a variety of communication systems 840 as well. It is also noted that various embodiments of LDPC decoding processing in accordance with LDPC decoding processing as presented herein, and equivalents thereof, may be applied to many types of communication systems and/or communication devices.

Figure 9:
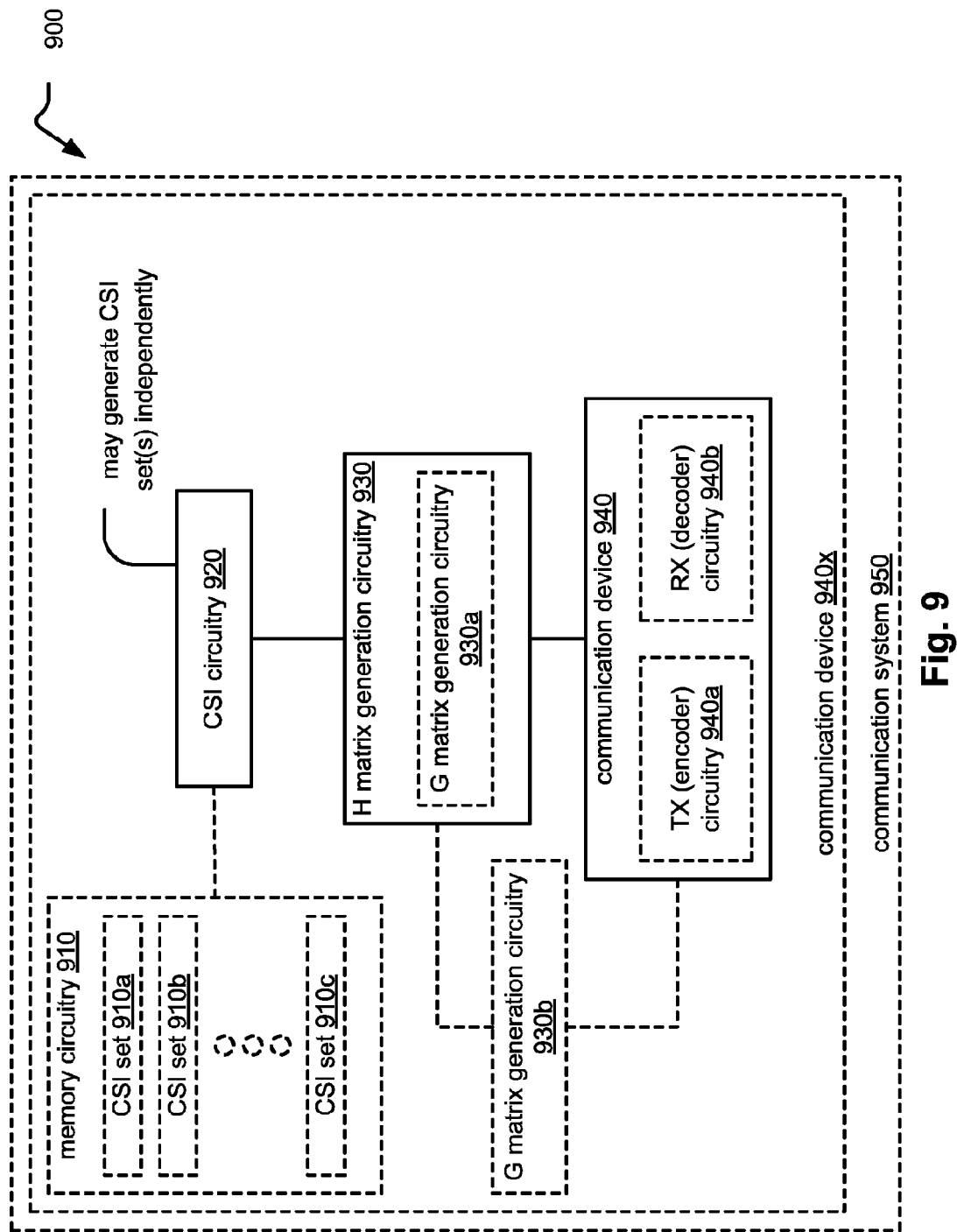
FIG. 9 illustrates an alternative embodiment of an apparatus that is operable to perform LDPC code construction and/or LDPC encoding and/or decoding processing.

FIG. 9 illustrates an alternative embodiment 900 of an apparatus that is operable to perform LDPC code construction and/or LDPC encoding and/or decoding processing. A CSI (Cyclic Shifted Identity) circuitry 920 operates to generate one or more sets of CSI values for cyclic shifting identity sub-matrices of one or more sub-matrix sizes. In some embodiments, the CSI circuitry 920 retrieves one or more sets of CSI values from a memory circuitry 910 that is coupled to the CSI circuitry 920. For example, the memory circuitry 910 can store one or more different CSI sets (shown as CSI set 910a, CSI set 910b, . . . and up to CSI set 910c). These CSI sets 910a-910c within the memory circuitry 910, or alternatively those CSI sets generated by the CSI circuitry 920, can include all information needed to generate an LDPC matrix including any information corresponding to adding or XOR-ing of various sub-matrices (each of which may be a CSI sub-matrix) to generate a final sub-matrix for a particular position within an LDPC matrix.

The CSI circuitry 920 can select one or more of the CSI sets 910a-910c as desired. Regardless of the manner by which the CSI circuitry 920 determines the one or more of the CSI sets, the CSI circuitry 920 then passes the one or more of the CSI sets to an LDPC matrix (H) generation circuitry 930, and the LDPC matrix (H) generation circuitry 930 then generates an LDPC matrix (H) corresponding to that particular LDPC code.

It is noted that once an LDPC matrix (H) is known, a corresponding LDPC generator matrix (G) can be determined as well. Generally speaking, an LDPC matrix (H) is the inverse of the corresponding LDPC generator matrix (G), and vice versa. Once the LDPC matrix (H) is known, then the corresponding LDPC generator matrix (G) may be directly determined.

An LDPC generator matrix (G) is that matrix by which information bits (e.g., an input bit group, tuple, stream, etc.) is multiplied to generate an LDPC codeword corresponding to that particular LDPC code. In some embodiments, an integrated LDPC generator matrix (G) circuitry 930a is included within the LDPC matrix (H) generation circuitry 930, so that such an LDPC generator matrix (G) can also be generated. In other embodiments, a separate LDPC generator matrix (G) circuitry 930b is coupled to the LDPC matrix (H) generation circuitry 930 that constructs the LDPC generator matrix (G).

A communication device 940 receives one or both of the constructed LDPC matrix (H) and the LDPC generator matrix (G). The communication device 940 may include a transmitter (TX) (encoder) circuitry 940a and a receiver (RX) (decoder) circuitry 940b.

The TX (encoder) circuitry 940a is operable to perform all necessary encoding in accordance with the LDPC generator matrix (G), as well as any appropriate transmitter related functions (e.g., digital to analog conversion, filtering (analog or digital), scaling (e.g., gain or attenuation), etc.) to generate a continuous time signal capable of being launched into a communication channel of interest.

The RX (decoder) circuitry 940b is operable to perform all necessary encoding in accordance with the LDPC matrix (H), as well as any appropriate receiver related functions (e.g., analog to digital conversion (sampling), filtering (analog or digital), scaling (e.g., gain or attenuation), equalization, etc.) to process a received continuous time and to make estimates of information bits encoded therein.

It is noted that all circuitries, memory, and/or modules, etc. depicted in this diagram may alternatively be implemented in a communication device 940x. The communication device 940 or the communication device 940x may be implemented within a communication system 950 which may, in some embodiments, be any such communication system type as depicted and described with reference to FIG. 1.

Figure 10:
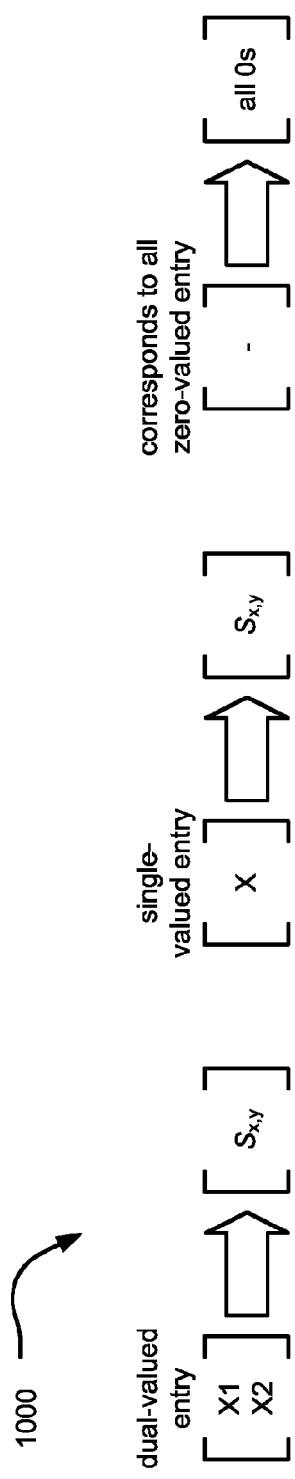
FIG. 10 illustrates an embodiment of an LDPC matrix.

FIG. 10 illustrates an embodiment 1000 of an LDPC matrix. This diagram corresponds to an LDPC matrix (i.e., a parity check matrix) having a code rate or 7/8. In this LDPC matrix, some entries have two numbers (e.g., they are dual-valued entries).

In this embodiment 1000, two corresponding CSI sub-matrices (e.g., permutation and/or cyclic shifted identity sub-matrices) are combined to generate the resultant sub-matrix corresponding to that particular entry's location. For example, the dual-valued entry of 6 and 12, in the upper left hand corner, corresponds to a first preliminary CSI sub-matrix having a shift-value, λ(6), and a second preliminary CSI sub-matrix having a shift-value, λ(12). These two preliminary sub-matrices are then combined (e.g., using addition, exclusive-or (XOR) processing, some other means, etc.) to generate a resultant sub-matrix corresponding to that particular entry's location (i.e., such resultant sub-matrix being located in the upper left hand corner of the overall LDPC matrix).

Each entry within the entries of this LDPC matrix corresponds to a respective sub-matrix. For those entries which are dual-valued, then the corresponding sub-matrix is generated as described above.

For those entries which are single-valued (i.e., have a single number therein), each sub-matrix therein is CSI sub-matrix S is characterized by a shift-value, λ(S). For example, the lower left hand sub-matrix has a value of 13, and is therefore a CSI sub-matrix with a shift-value of 13, λ(13). As also mentioned herein, a CSI sub-matrix with a shift-value of 0, λ(0), is an identity sub-matrix (e.g., such as those depicted in the right hand side matrix ($H_2$)). All of the sub-matrices depicted as a "−" are all zero-valued sub-matrices.

Referring again to the particular embodiment 1000 of this diagram, the bit degree on a corresponding column becomes 4 (i.e., because of the generation of a corresponding resultant sub-matrix formed by combined two CSI sub-matrices—see the resultant sub-matrix corresponding to the top left hand entry).

Figure 11:
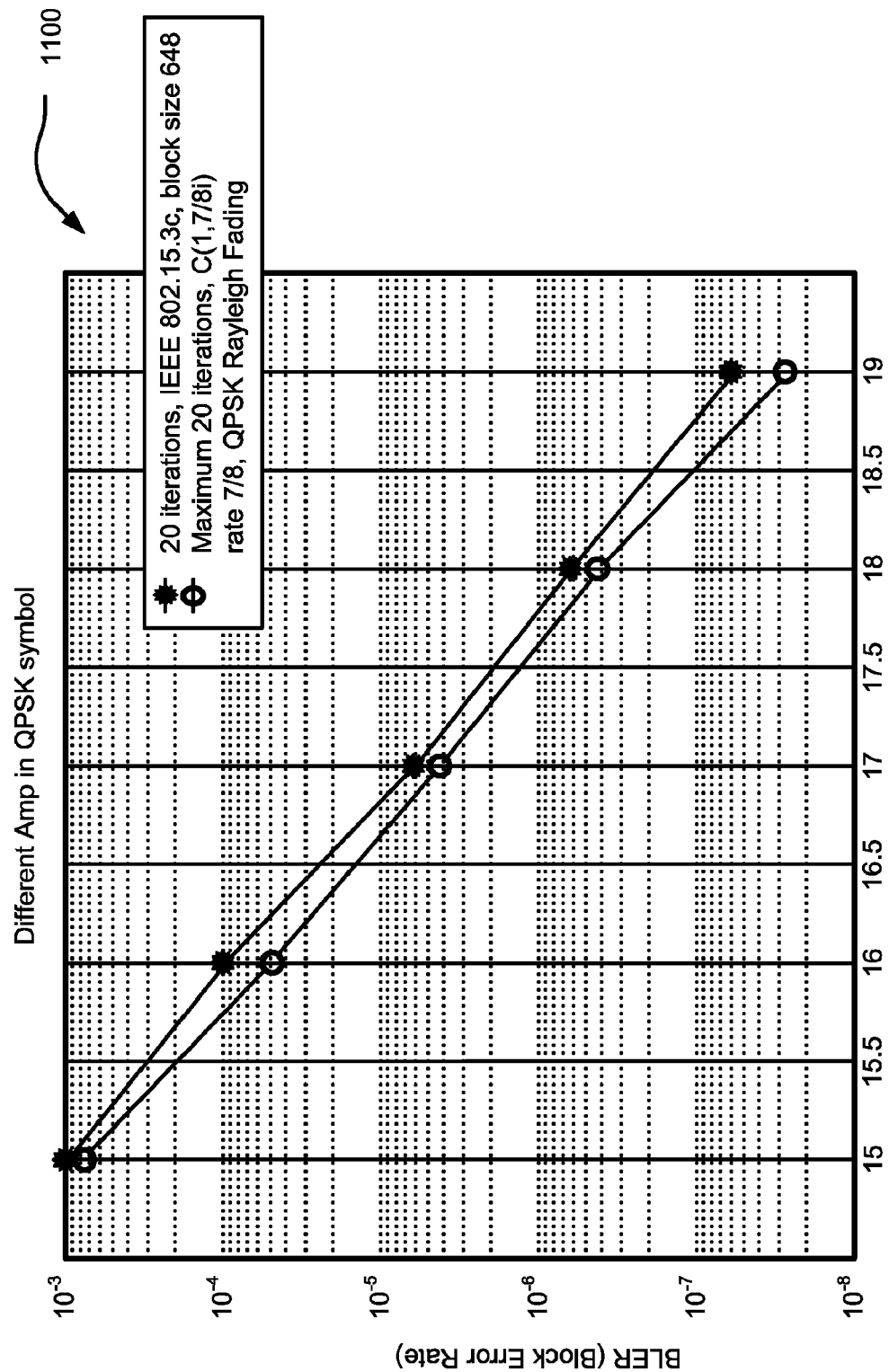
FIG. 11 illustrates an embodiment of performance comparisons of various rate 7/8 LDPC cods using QPSK on a Rayleigh fading communication channel.

FIG. 11 illustrates an embodiment 1100 of performance comparisons of various rate 7/8 LDPC cods using QPSK on a Rayleigh fading communication channel.

Oftentimes performance diagrams are described in the context of BLER (Block Error Rate) [or BER (Bit Error Rate)] versus $E_b/N_o$ (ratio of energy per bit $E_b$ to the Spectral Noise Density $N_o$) or SNR (Signal to Noise Ratio). This term $E_b/N_o$ is the measure of SNR for a digital communication system. When looking at such performance curves, the BLER [or BER] may be determined for any given $E_b/N_o$ (or SNR) thereby providing a relatively concise representation of the performance of the decoding approach.

The following simulations and performance comparisons are performed on a Rayleigh fading communication channel. The type of modulation employed is quadrature phase shift keying (QPSK). The maximum number of LDPC decoding iterations is 20, and the BLER is estimated to below $1 \times 10^{-7}$. As mentioned above, any type of overall LDPC decoder architecture which may be employed, e.g., whether fully parallel, partially parallel, or serial in a particular architecture/hardware implementation.

When comparing the performance of the rate 7/8 LDPC code described with reference to FIG. 10, it can be seen that the performance gain compared to IEEE 802.15.3c is modest; though there is in fact performance gain. However, by using the LDPC matrix construction approach presented herein, it makes it possible for an LDPC matrix (i.e., a parity check matrix) with sub-matrices of size 28×28 while still providing for the construction of LDPC codes having a higher code rate and a higher bit-degree. In this way, the sub-matrix size for the LDPC matrix can be kept the same (e.g., 28×28) for all possible code rates (e.g., not only for size 21×21 (which is an odd number) and which is employed by the IEEE 802.15.3c).

One design benefit for employing an LDPC matrix with a bit degree of at least 4 is that with a maximal bit degree of 3, such LDPC codes don't perform well below $1 \times 10^{-4}$. Using the novel approach presented herein, even more than 2 preliminary CSI sub-matrices may be combined (e.g., 3, 4, etc.) to generate a corresponding resultant sub-matrix; such an approach can provide for an even better performance on a lower BLER.

Figure 12A:
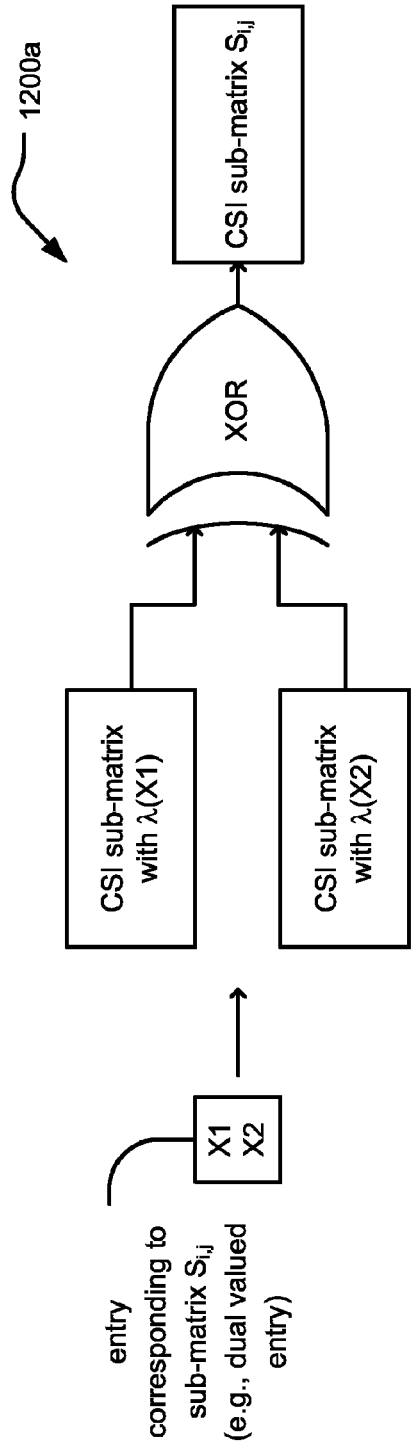
FIG. 12A and FIG. 12B illustrate embodiments of sub-matrix generation in accordance with LDPC matrix construction.
Figure 12B:
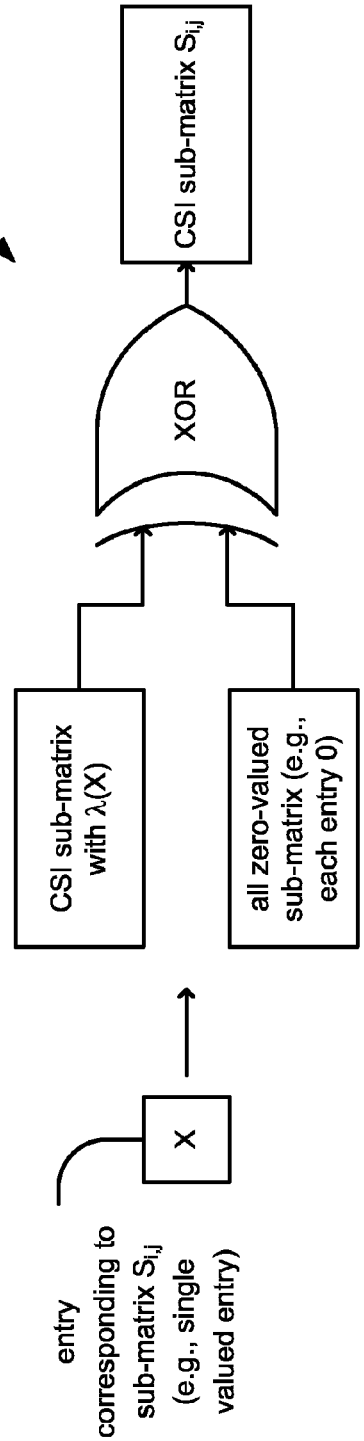

FIG. 12A and FIG. 12B illustrate embodiments of sub-matrix generation in accordance with LDPC matrix construction.

Referring to embodiment 1200a of FIG. 12A, when a corresponding entry is a dual-valued entry, then two separate preliminary CSI sub-matrices may be generated, shown as λ(X1) and λ(X2) corresponding to the first portion of the dual-valued entry and the second portion of the dual-valued entry, respectively. Clearly, if a corresponding entry is a three valued entry, then three separate CSI sub-matrices may be generated, etc. The first preliminary CSI sub-matrix and the second preliminary CSI sub-matrix undergo exclusive-or (XOR) processing to generate a resultant sub-matrix that is located within the LDPC matrix as determined by the dual-valued entry's location.

Referring to embodiment 1200b of FIG. 12B, when a corresponding entry is a single-valued entry, then a single CSI sub-matrix may be generated, shown as λ(X), that is located within the LDPC matrix as determined by the single-valued entry's location. However, this may also be understood as generating two separate preliminary CSI sub-matrices may be generated, shown as λ(0) and "−" corresponding to the single-valued entry and an all zero valued sub-matrix, respectively. The CSI sub-matrix and the second all zero valued sub-matrix undergo exclusive-or (XOR) processing to generate a resultant sub-matrix that is located within the LDPC matrix as determined by the dual-valued entry's location.

Figure 13A:
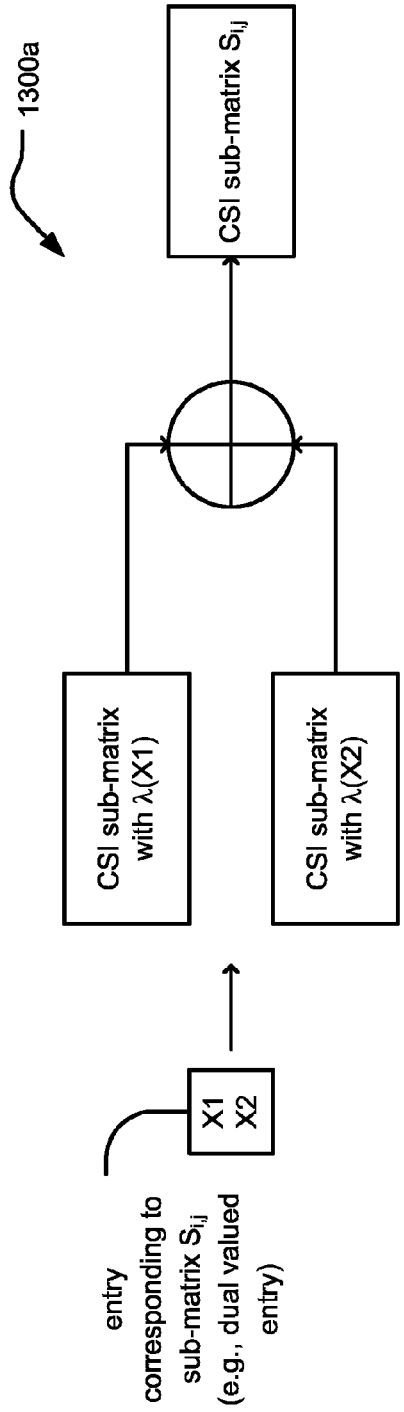
FIG. 13A and FIG. 13B illustrate alternative embodiments of sub-matrix generation in accordance with LDPC matrix construction.
Figure 13B:
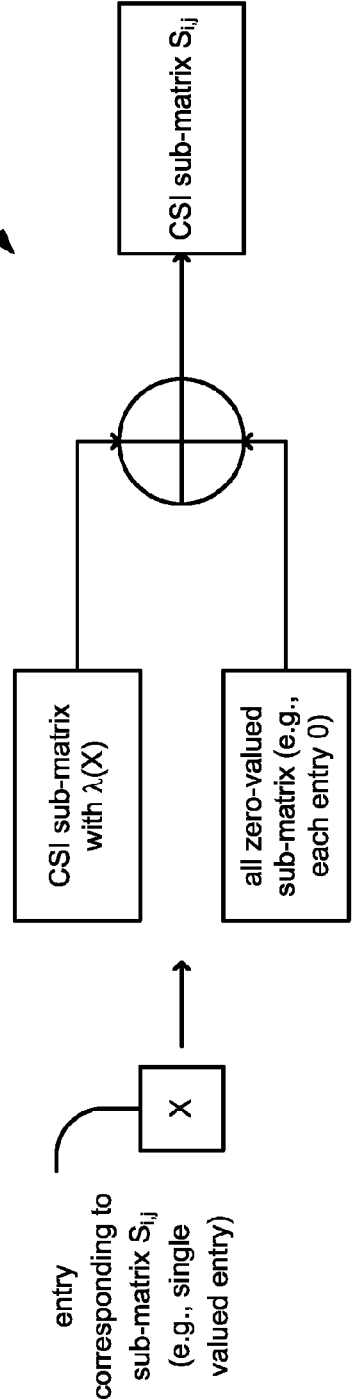

FIG. 13A and FIG. 13B illustrate alternative embodiments of sub-matrix generation in accordance with LDPC matrix construction.

Referring to embodiment 1300a of FIG. 13A, this embodiment is analogous to the embodiment 1200a of FIG. 12A, but with an adder circuitry replacing the XOR circuitry.

Referring to embodiment 1300b of FIG. 13B, this embodiment is analogous to the embodiment 1200b of FIG. 12B, but with an adder circuitry replacing the XOR circuitry.

Figure 14A:
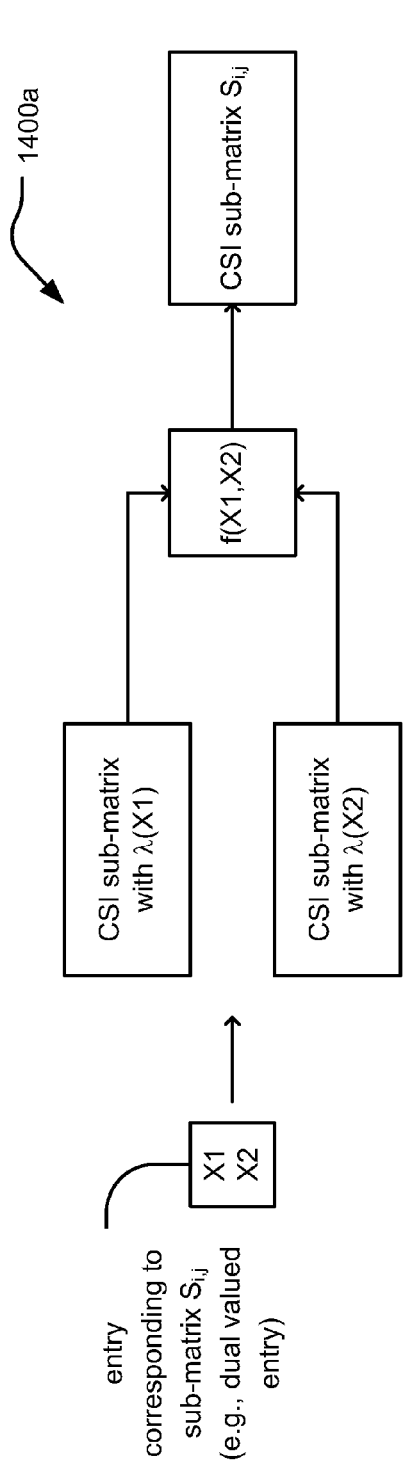
FIG. 14A and FIG. 14B illustrate alternative embodiments of sub-matrix generation in accordance with LDPC matrix construction.
Figure 14B:
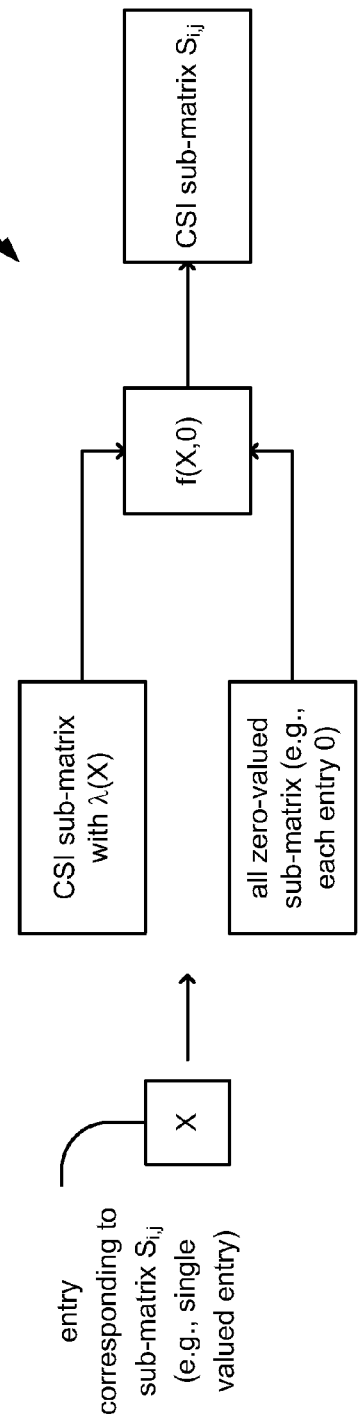

FIG. 14A and FIG. 14B illustrate alternative embodiments of sub-matrix generation in accordance with LDPC matrix construction.

Referring to embodiment 1400a of FIG. 14A, this embodiment is analogous to the embodiment 1200a of FIG. 12A and embodiment 1300a of FIG. 13A, but with a desired function that operates on each of the input values X1, X2 of a dual-valued entry within a CSI parameter set. Generally speaking, any desired mathematical function (including any type of operations including logical, Boolean, etc. operations) may be employed to generate a final sub-matrix for use in generating an LDPC matrix.

Referring to embodiment 1400b of FIG. 14B, this embodiment is analogous to the embodiment 1200b of FIG. 12B and embodiment 1300b of FIG. 13B, but with the same desired function of embodiment 1400a of FIG. 14A that operates on each of the input values X, 0 (such that X corresponds to a single-valued entry) within a CSI parameter set.

Figure 15:
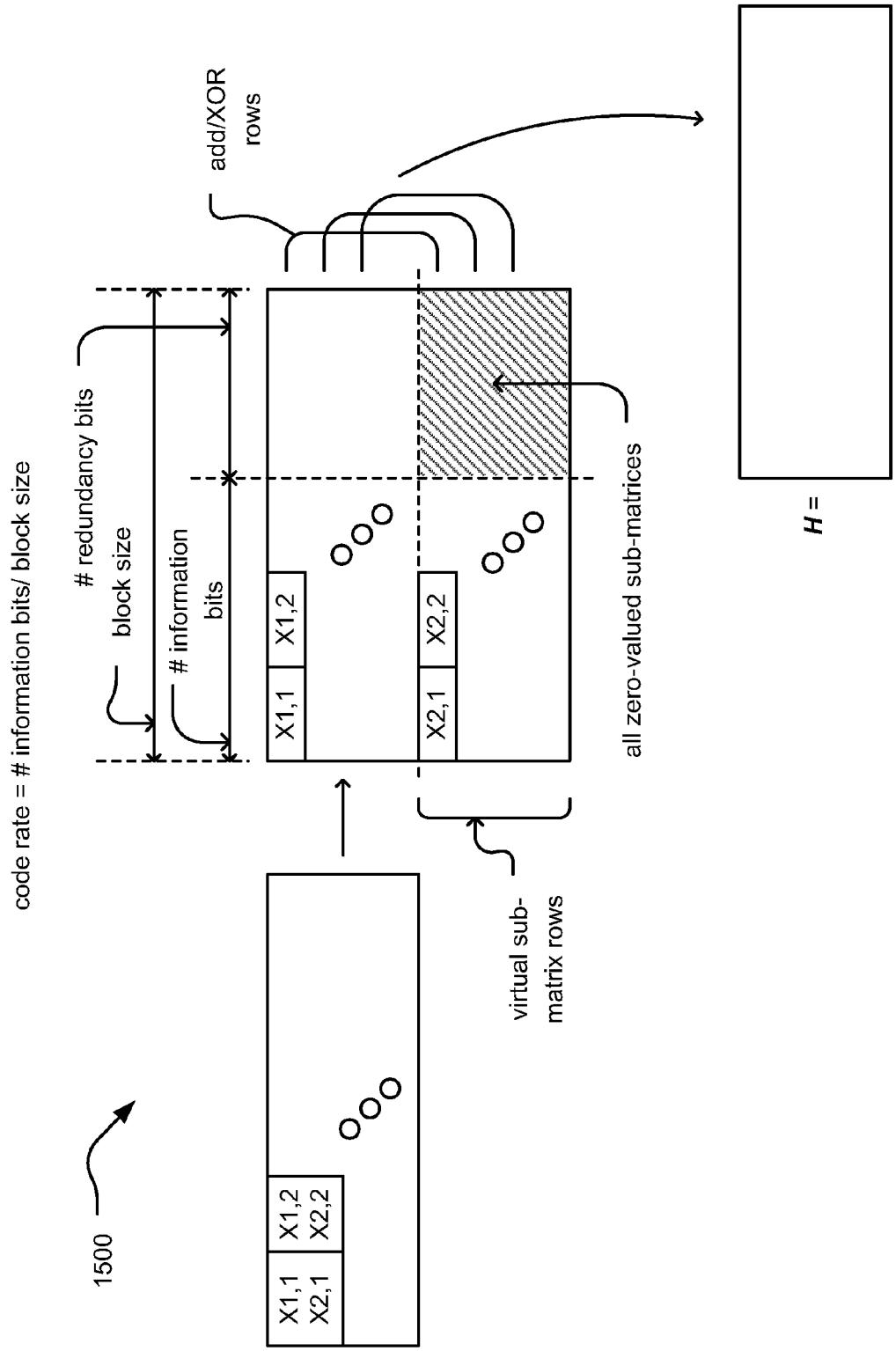
FIG. 15 illustrates an alternative embodiment of sub-matrix generation in accordance with LDPC matrix construction.

FIG. 15 illustrates an alternative embodiment 1500 of sub-matrix generation in accordance with LDPC matrix construction. Entries of an LDPC matrix are employed to generate the corresponding sub-matrices of the LDPC matrix. Consider that the LDPC matrix has entries corresponding to A number of rows and B number of columns. The total number of columns corresponds to the block size of the LDPC code, and the code rate of the LDPC code is the number of information bits divided by the block size. The number of redundancy bits is, of course, the block size minus the number of information bits.

For example, in this embodiment 1500, a dual-valued entry of X1,1 & X1,2 is used to form a first preliminary CSI sub-matrix in a first sub-matrix row of an intermediate generated matrix, and then a second preliminary CSI sub-matrix in an $A+1^{th}$ sub-matrix row of the intermediate generated matrix.

Similarly, a dual-valued entry of X2,1 & X2,2 is used to form a third preliminary CSI sub-matrix in the first sub-matrix row of the intermediate generated matrix, and then a fourth preliminary CSI sub-matrix in the $A+1^{th}$ sub-matrix row of the intermediate generated matrix.

After all preliminary sub-matrices have been formed in the first sub-matrix row and the $A+1^{th}$ sub-matrix row, then the first sub-matrix row and the $A+1^{th}$ sub-matrix row are combined (e.g., using XOR processing, addition, etc.) to form a first row of the resulting LDPC matrix, shown as H. It is noted that the intermediate generated matrix includes virtual sub-matrix rows (e.g., shown in the lower half of the intermediate generated matrix). The corresponding redundancy/parity bit columns within the virtual sub-matrix rows are kept to be all-zero values sub-matrices, so that when combined with the upper sub-matrices rows of the intermediate generated matrix, there is no modification of the true redundancy/parity bit columns within the resulting LDPC matrix, shown as H.

Figure 16:
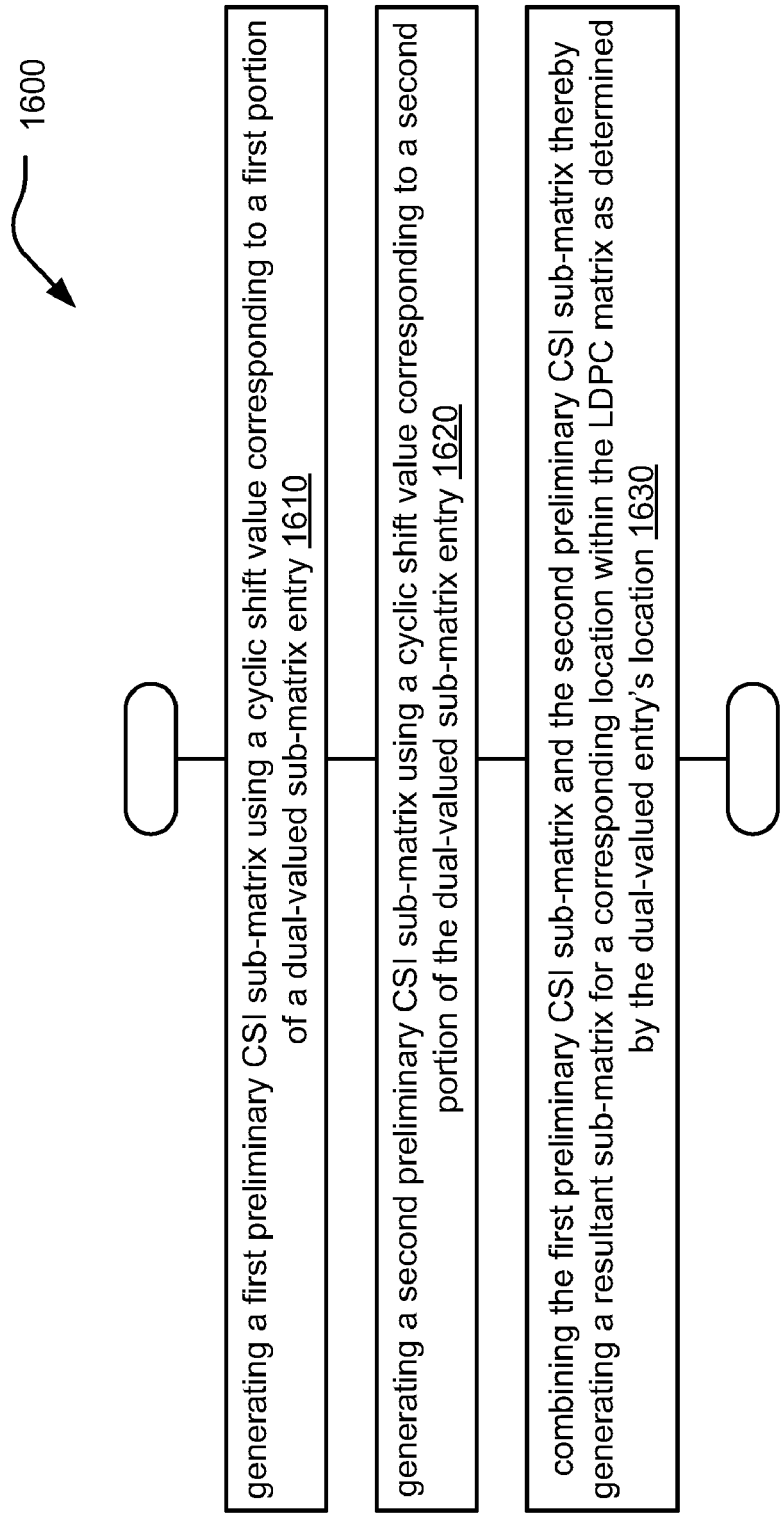
FIG. 16 illustrates an embodiment of a method for sub-matrix generation in accordance with LDPC matrix construction.

FIG. 16 illustrates an embodiment 1600 of a method for sub-matrix generation in accordance with LDPC matrix construction. The method operates by generating a first preliminary CSI sub-matrix using a cyclic shift value corresponding to a first portion of a dual-valued sub-matrix entry, as shown in a block 1610.

The method operates by generating a second preliminary CSI sub-matrix using a cyclic shift value corresponding to a second portion of the dual-valued sub-matrix entry, as shown in a block 1620.

The method then operates by combining the first preliminary CSI sub-matrix and the second preliminary CSI sub-matrix thereby generating a resultant sub-matrix for a corresponding location within the LDPC matrix as determined by the dual-valued entry's location, as shown in a block 1630.

FIG. 17A illustrates an embodiment 1700 of a method for LDPC matrix generation and subsequent use in decoding an LDPC coded signal. Referring to method 1700 of FIG. 17A, the method 1700 begins by identifying a CSI parameter set, as shown in a block 1710. In some embodiments, this identification may be made by generating the CSI parameter set using some predetermined function. In other embodiments, the CSI parameter set may be selected from among a number of possible CSI parameter sets (e.g., as being selected from a memory circuitry that stores a number of possible CSI parameter sets).

The method 1700 continues by employing the CSI parameter set to generate an LDPC matrix, as shown in a block 1720. The method 1700 then operates by employing a decoder circuitry to employ the LDPC matrix to decode an LDPC coded signal thereby generating an estimate of an information bit encoded therein, as shown in a block 1730.

FIG. 17B illustrates an embodiment 1701 of a method for LDPC matrix generation. Referring to method 1701 of FIG. 17B, the method 1701 begins by generating a first CSI sub-matrix having a cyclic shift corresponding to a single-valued entry of a CSI parameter set, as shown in a block 1711. The method 1701 then operates by generating a second CSI sub-matrix based on a dual-valued entry of the CSI parameter set, as shown in a block 1721. As within other embodiments, the CSI parameter set may be identified or generated using some predetermined function. In other embodiments, the CSI parameter set may be selected from among a number of possible CSI parameter sets (e.g., as being selected from a memory circuitry that stores a number of possible CSI parameter sets).

The method 1701 continues by employing the first CSI sub-matrix and the second CSI sub-matrix to generate an LDPC matrix, as shown in a block 1731.

FIG. 18A illustrates an embodiment 1800 of a method for LDPC generator matrix generation and subsequent use in encoding to generate an LDPC coded signal. Referring to method 1800 of FIG. 18A, the method 1800 begins by processing an LDPC matrix thereby generating an LDPC generator matrix, as shown in a block 1810. The method 1800 continues by employing an encoder circuitry, that uses the LDPC generator matrix, to encode an information bit thereby generating an LDPC coded signal, as shown in a block 1820.

The method 1800 then operates by processing the LDPC coded signal to generate a continuous-time signal that comports with a communication channel, as shown in a block 1830. This may involve any of a number of operations including gain adjustment, frequency adjustment, filtering, digital to analog conversion to generate the continuous-time signal, etc. The method 1800 continues by launching the continuous-time signal into the communication channel, as shown in a block 1840.

FIG. 18B illustrates an embodiment 1801 of an alternative method for LDPC matrix generation and subsequent use in decoding an LDPC coded signal. Referring to method 1801 of FIG. 18B, the method 1801 begins by storing store a plurality of CSI parameter sets within a memory circuitry, as shown in a block 1811. The method 1801 then operates by identifying a CSI parameter set from among the plurality of CSI parameter sets stored within the memory circuitry, as shown in a block 1821.

The method 1801 continues by employing the CSI parameter set to generate an LDPC matrix, as shown in a block 1831. The method 1801 then operates by employing a decoder circuitry to employ the LDPC matrix to decode an LDPC coded signal thereby generating an estimate of an information bit encoded therein, as shown in a block 1841.

It is noted that the novel approaches and aspects of LDPC code construction presented herein can be broadly applied to any size of LDPC matrix, and to LDPC matrices having any desired size of sub-matrix. The particular embodiments described herein are for illustrative purposes for the reader's comprehension, and it will be understood that such principles can be applied to larger (or smaller) and generally different sized sub-matrices and LDPC matrices without departing from the scope and spirit of the invention.

It is noted that the various circuitries and/or modules (e.g., encoding circuitries, decoding circuitries, circuitry, and/or circuitries, etc.) described herein may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The operational instructions may be stored in a memory. The memory may be a single memory device or a plurality of memory devices. Such a memory device may be a read-only memory, random access memory, volatile memory, non-volatile memory, static memory, dynamic memory, flash memory, and/or any device that stores digital information. It is also noted that when the processing circuitry implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. In such an embodiment, a memory stores, and a processing circuitry coupled thereto executes, operational instructions corresponding to at least some of the steps and/or functions illustrated and/or described herein.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention.

One of average skill in the art will also recognize that the functional building blocks, and other illustrative blocks, circuitries, modules and components herein, can be implemented as illustrated or by discrete components, application specific integrated circuits, processors executing appropriate software and the like or any combination thereof.

Moreover, although described in detail for purposes of clarity and understanding by way of the aforementioned embodiments, the present invention is not limited to such embodiments. It will be obvious to one of average skill in the art that various changes and modifications may be practiced within the spirit and scope of the invention, as limited only by the scope of the appended claims.

What is claimed is:

1. An apparatus, comprising:
   a memory to store the CSI (Cyclic Shifted Identity) parameter set including at least one dual valued-entry and at least one single-valued entry;
   an input to receive an LDPC (Low Density Parity Check) coded signal; and
   an LDPC decoder to decode the LDPC coded signal using an LDPC matrix, including a plurality of sub-matrices each having the common size, such that at least one of the plurality of sub-matrices corresponding to the at least one dual valued-entry of a CSI parameter set and at least one additional of the plurality of sub-matrices corresponding to the at least one single-valued entry of the CSI parameter set; and wherein:
   the at least one of the plurality of sub-matrices corresponding to the at least one dual valued-entry generated from a first preliminary CSI sub-matrix corresponding to a first portion of the at least one dual valued-entry and from a second preliminary CSI sub-matrix corresponding to a second portion of the at least one dual valued-entry.

2. The apparatus of claim 1, wherein:
   the LDPC matrix being partitioned into a left hand side matrix and a right hand side matrix; and each sub-matrix within the right hand side matrix being a respective all zero-valued sub-matrix except those sub-matrices identified below in (a) and (b):
  (a) each sub-matrix located on a diagonal of the right hand side matrix being a respective CSI sub-matrix; and
  (b) in every row between a second row, which is below and adjacent to a top row, and a bottom row of the right hand side matrix, inclusive, each sub-matrix located on a left hand side of and adjacent to a sub-matrix located on the diagonal of the right hand side matrix being also a respective CSI sub-matrix.

3. The apparatus of claim 1, further comprising:
an LDPC matrix generation circuitry to generate the at least one additional of the plurality of sub-matrices corresponding to the at least one single-valued entry of the CSI parameter set for a corresponding location within the LDPC matrix as determined by a location of the single-valued entry within the CSI parameter set.

4. The apparatus of claim 1, further comprising:
an LDPC generator matrix generation circuitry to process the LDPC matrix to generate an LDPC generator matrix; and
an encoder circuitry to employ the LDPC generator matrix to encode at least one additional information bit to generate at least one additional LDPC coded signal.

5. The apparatus of claim 1, wherein:
the apparatus being a communication device operative within at least one of a satellite communication system, a wireless communication system, a wired communication system, and a fiber-optic communication system.

6. An apparatus, comprising:
an input to receive an LDPC (Low Density Parity Check) coded signal; and
an LDPC decoder to decode the LDPC coded signal using an LDPC matrix, including a plurality of sub-matrices each having the common size, such that at least one of the plurality of sub-matrices corresponding to at least one dual valued-entry of a CSI (Cyclic Shifted Identity) parameter set and at least one additional of the plurality of sub-matrices corresponding to at least one single-valued entry of the CSI parameter set.

7. The apparatus of claim 6, wherein:
the LDPC matrix being partitioned into a left hand side matrix and a right hand side matrix; and
each sub-matrix within the right hand side matrix being a respective all zero-valued sub-matrix except those sub-matrices identified below in (a) and (b):
  (a) each sub-matrix located on a diagonal of the right hand side matrix being a respective CSI sub-matrix; and
  (b) in every row between a second row, which is below and adjacent to a top row, and a bottom row of the right hand side matrix, inclusive, each sub-matrix located on a left hand side of and adjacent to a sub-matrix located on the diagonal of the right hand side matrix being also a respective CSI sub-matrix.

8. The apparatus of claim 7, wherein:
each respective CSI sub-matrix located on the diagonal of the right hand side matrix identified above in (a) and (b) being a respective identity sub-matrix or a respective CSI matrix corresponding to a cyclic shift of 0.

9. The apparatus of claim 6, wherein:
the at least one of the plurality of sub-matrices corresponding to the at least one dual valued-entry generated from a first preliminary CSI sub-matrix corresponding to a first portion of the at least one dual valued-entry and from a second preliminary CSI sub-matrix corresponding to a second portion of the at least one dual valued-entry.

10. The apparatus of claim 6, further comprising:
a memory to store the CSI parameter set including the at least one dual valued-entry and the at least one single-valued entry.

11. The apparatus of claim 6, further comprising:
an LDPC matrix generation circuitry to generate the at least one additional of the plurality of sub-matrices corresponding to the at least one single-valued entry of the CSI parameter set for a corresponding location within the LDPC matrix as determined by a location of the single-valued entry within the CSI parameter set.

12. The apparatus of claim 6, further comprising:
an LDPC generator matrix generation circuitry to process the LDPC matrix to generate an LDPC generator matrix; and
an encoder circuitry to employ the LDPC generator matrix to encode at least one additional information bit to generate at least one additional LDPC coded signal.

13. The apparatus of claim 6, wherein:
the apparatus being a communication device operative within at least one of a satellite communication system, a wireless communication system, a wired communication system, and a fiber-optic communication system.

14. A method for operating a communication device, the method comprising:
via an input of the communication device, receiving an LDPC (Low Density Parity Check) coded signal; and
decoding the LDPC coded signal using an LDPC matrix, including a plurality of sub-matrices each having the common size, such that at least one of the plurality of sub-matrices corresponding to at least one dual valued-entry of a CSI (Cyclic Shifted Identity) parameter set and at least one additional of the plurality of sub-matrices corresponding to at least one single-valued entry of the CSI parameter set.

15. The method of claim 14, wherein:
the LDPC matrix being partitioned into a left hand side matrix and a right hand side matrix; and
each sub-matrix within the right hand side matrix being a respective all zero-valued sub-matrix except those sub-matrices identified below in (a) and (b):
  (a) each sub-matrix located on a diagonal of the right hand side matrix being a respective CSI sub-matrix; and
  (b) in every row between a second row, which is below and adjacent to a top row, and a bottom row of the right hand side matrix, inclusive, each sub-matrix located on a left hand side of and adjacent to a sub-matrix located on the diagonal of the right hand side matrix being also a respective CSI sub-matrix.

16. The method of claim 15, wherein:
each respective CSI sub-matrix located on the diagonal of the right hand side matrix identified above in (a) and (b) being a respective identity sub-matrix or a respective CSI matrix corresponding to a cyclic shift of 0.

17. The method of claim 14, further comprising:
generating the at least one of the plurality of sub-matrices corresponding to the at least one dual valued-entry generated from a first preliminary CSI sub-matrix corresponding to a first portion of the at least one dual valued-entry and from a second preliminary CSI sub-matrix corresponding to a second portion of the at least one dual valued-entry.

18. The method of claim 14, further comprising:
within a memory of the communication device, storing the CSI parameter set including the at least one dual valued-entry and the at least one single-valued entry.

19. The method of claim 14, further comprising:
processing the LDPC matrix to generate an LDPC generator matrix; and
encoding at least one additional information bit, using the LDPC generator matrix, to generate at least one additional LDPC coded signal.

20. The method of claim 14, wherein:
the communication device operative within at least one of a satellite communication system, a wireless communication system, a wired communication system, and a fiber-optic communication system.

* * * * *